US012804881B2

(12) United States Patent
Huang

(10) Patent No.: US 12,804,881 B2
(45) Date of Patent: Nov. 17, 2026

(54) RECESS GATE AND INTERCONNECTOR STRUCTURE AND METHOD FOR PREPARING THE SAME

(71) Applicant: NANYA TECHNOLOGY CORPORATION, New Taipei City (TW)

(72) Inventor: Chih-Wei Huang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 364 days.

(21) Appl. No.: 18/604,812

(22) Filed: Mar. 14, 2024

(65) Prior Publication Data

US 2025/0267837 A1 Aug. 21, 2025

Related U.S. Application Data

(62) Division of application No. 18/443,733, filed on Feb. 16, 2024.

(51) Int. Cl.
*H10B 12/00* (2023.01)

(52) U.S. Cl.
CPC ....... *H10B 12/315* (2023.02); *H10B 12/0335* (2023.02); *H10B 12/34* (2023.02)

(58) Field of Classification Search
None
See application file for complete search history.

(56) References Cited

U.S. PATENT DOCUMENTS

| | | | | |
|---|---|---|---|---|
| 10,170,484 B1 * | 1/2019 | Sung | ...................... | H10B 10/12 |
| 10,312,243 B2 * | 6/2019 | Lee | ...................... | H10B 12/053 |
| 12,268,029 B2 * | 4/2025 | Tsai | ...................... | H10D 64/513 |
| 12,317,571 B2 * | 5/2025 | Tsai | ...................... | H10B 12/34 |
| 2013/0207171 A1 * | 8/2013 | Uno | ...................... | C23C 16/18 438/785 |

(Continued)

FOREIGN PATENT DOCUMENTS

| | | |
|---|---|---|
| TW | 202201734 A | 1/2022 |
| TW | 202406105 A | 2/2024 |

OTHER PUBLICATIONS

Office Action and and the search report mailed on Jan. 9, 2025 related to Taiwanese Application No. 113112709.

(Continued)

*Primary Examiner* — Nishath Yasmeen
(74) *Attorney, Agent, or Firm* — Xuan Zhang

(57) ABSTRACT

The present application provides a semiconductor device and a method for preparing the same. The semiconductor device includes a substrate having an active region; a recess gate structure disposed in the substrate and intersecting the active region; a conductive pillar disposed over the substrate and electrically connected to the active region; a landing pad disposed on the conductive pillar and electrically connected to the conductive pillar; and a stack of dielectric layers disposed over the substrate and laterally surrounding the conductive pillar and the landing pad. The semiconductor device also includes a contact structure disposed between the substrate and the conductive pillar, a capacitor plug disposed on the landing pad and electrically connected to the landing pad, and a storage capacitor disposed on the capacitor plug and electrically connected to the capacitor plug.

16 Claims, 28 Drawing Sheets

(56) References Cited

U.S. PATENT DOCUMENTS

| | | | | |
|---|---|---|---|---|
| 2017/0365608 | A1* | 12/2017 | Lee | H10B 12/033 |
| 2019/0109139 | A1 | 4/2019 | Wu et al. | |
| 2019/0164977 | A1* | 5/2019 | Lin | H10B 12/053 |
| 2020/0006566 | A1 | 1/2020 | Chien et al. | |
| 2020/0381436 | A1* | 12/2020 | Noh | H10B 12/053 |
| 2021/0407908 | A1 | 12/2021 | Huang | |
| 2021/0408005 | A1* | 12/2021 | Chen | H10B 12/0335 |
| 2022/0037510 | A1* | 2/2022 | Cheng | H10D 30/024 |
| 2022/0393028 | A1 | 12/2022 | Lu et al. | |
| 2023/0328970 | A1 | 10/2023 | Lai | |
| 2023/0361118 | A1 | 11/2023 | Karda et al. | |
| 2024/0222370 | A1* | 7/2024 | Huang | H10D 84/014 |

OTHER PUBLICATIONS

Summary translation of Office Action and and the search report mailed on Jan. 9, 2025 related to Taiwanese Application No. 113112709.

Office Action and and the search report mailed on May 13, 2025 related to Taiwanese Application No. 113145682.

Summary translation of Office Action and and the search report mailed on May 13, 2025 related to Taiwanese Application No. 113145682.

Office Action and and the search report mailed on Apr. 15, 2026 related to U.S. Appl. No. 18/443,733.

Office Action and and the search report mailed on May 19, 2026 related to U.S. Appl. No. 18/635,343.

Office Action and and the search report mailed on Jun. 3, 2026 related to U.S. Appl. No. 18/443,733.

Office Action and and the search report mailed on Jun. 24, 2026 related to U.S. Appl. No. 18/635,343.

Office Action and and the search report mailed on May 12, 2026 related to U.S. Appl. No. 18/599,255.

* cited by examiner

RECESS GATE AND INTERCONNECTOR STRUCTURE AND METHOD FOR PREPARING THE SAME

CROSS-REFERENCE TO RELATED APPLICATION

This application is a divisional application of U.S. Non-Provisional application Ser. No. 18/443,733 filed Feb. 16, 2024, which is incorporated herein by reference in its entirety.

TECHNICAL FIELD

The present disclosure relates to a semiconductor device and a method for manufacturing the device, and more particularly, to a semiconductor device having a recess gate and an interconnector structure, and a method for manufacturing the same.

DISCUSSION OF THE BACKGROUND

The semiconductor industry has developed over the years to create devices with better performance at competitive or lower costs. Such developments have resulted in the continuous reduction of scale of semiconductor devices, which has been realized by numerous and mutually-supportive advances in semiconductor manufacturing processes, along with advances in materials and new device designs.

Dynamic random-access memory (DRAM) is a type of semiconductor device consisting of an array of memory cells each having a field-effect transistor and a capacitor. The field-effect transistor provides access to the capacitor, and the capacitor is configured for data storage. As DRAM continues to be scaled down, space between adjacent memory cells is significantly reduced. As a consequence, parasitic capacitance between adjacent memory cells is increased, and such increases in parasitic capacitance limit operation speeds of DRAM.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In an aspect of the present disclosure, a semiconductor device is provided. The semiconductor device comprises: a substrate having an active region; a recess gate structure disposed in the substrate and intersecting the active region; a conductive pillar disposed over the substrate and electrically connected to the active region; a landing pad disposed on the conductive pillar and electrically connected to the conductive pillar; and a stack of dielectric layers disposed over the substrate and laterally surrounding the conductive pillar and the landing pad.

In some embodiments, the recess gate structure comprises a gate insulating layer conformally formed in a trench disposed in the substrate; a work function layer formed on the gate insulating layer and in the trench; a first conductive layer formed on the work function layer and in the trench; and a capping layer formed on the first conductive layer and in the trench.

In some embodiments, the gate insulating layer is formed by a thermal oxidation process.

In some embodiments, the gate insulating layer includes a high-k material such as an oxide, a nitride, an oxynitride, or a combination thereof.

In some embodiments, the work function layer is formed of doped polycrystalline silicon, doped polycrystalline germanium or doped polycrystalline silicon germanium.

In some embodiments, the work function layer is formed by a deposition process and a subsequent etch-back process.

In some embodiments, the first conductive layer is formed of germanium.

In some embodiments, the first conductive layer is formed by a deposition process.

In some embodiments, the capping layer is formed of germanium oxide.

In some embodiments, the capping layer is formed by chemical vapor deposition, atomic layer deposition, or another applicable deposition process.

In some embodiments, the semiconductor device further comprises a liner layer conformally disposed on the first conductive layer and the gate insulating layer, and disposed between the capping layer and the first conductive layer; and a second conductive layer disposed between the capping layer and the liner layer.

In some embodiments, the liner layer includes a U-shaped cross-sectional profile.

In some embodiments, the liner layer is formed of a material having an etching selectivity to the gate insulating layer.

In some embodiments, the liner layer is formed of a material including $sp^2$ hybridized carbon atoms.

In some embodiments, the second conductive layer is formed of molybdenum.

In some embodiments, the second conductive layer is formed by a chemical vapor deposition process.

In some embodiments, the conductive pillar is formed by a first etching process and a second etching process following the first etching process.

In some embodiments, the landing pad is formed by the first etching process.

In some embodiments, the semiconductor device further comprises a contact structure disposed between the substrate and the conductive pillar, wherein the contact structure is electrically connected to the active region and the conductive pillar.

In some embodiments, the semiconductor device further comprises a capacitor plug disposed on the landing pad and electrically connected to the landing pad; and a storage capacitor disposed on the capacitor plug and electrically connected to the capacitor plug.

In another aspect of the present disclosure, a semiconductor device is provided. The semiconductor device comprises: a substrate; a word line disposed in the substrate; a dielectric liner disposed between the substrate and the word line, surrounding the word line; an insulative plug disposed in the substrate and extending into the word line; and an impurity region disposed in the substrate on either side of the word line, wherein the impurity region serves as a source/drain region of a recessed access device (RAD) transistor.

In some embodiments, the semiconductor device further comprises an isolation layer disposed in the substrate and employed to cap the word line; and a diffusion barrier liner disposed between the dielectric liner and the word line.

In some embodiments, the word line is made of germanium.

In some embodiments, the isolation layer is made of germanium oxide.

In another aspect of the present disclosure, a method for manufacturing a semiconductor device is provided. The method comprises: forming an active region in a substrate; forming a recess gate structure in the substrate, wherein the recess gate structure intersects the active region; forming at least one dielectric layer on the substrate; forming a bit line contact in the at least one dielectric layer; forming a bit line over the bit line contact and in an additional dielectric layer; forming a contact structure on the substrate, wherein the contact structure is located at a side of the recess gate structure and is electrically connected to the active region; sequentially forming a first conductive layer and a second conductive layer over the substrate, wherein the contact structure is covered by the first conductive layer and the second conductive layer; forming a conductive pillar and a landing pad over the substrate, wherein the conductive pillar overlaps and electrically connects to the contact structure, the landing pad covers and electrically connects to the conductive pillar, and a sidewall of the conductive pillar is laterally recessed from a sidewall of the landing pad; and forming a dielectric layer to laterally surround the conductive pillar and the landing pad.

In some embodiments, the formation of the landing pad is performed by a first etching process.

In some embodiments, the formation of the conductive pillar is performed by the first etching process and sequentially by a second etching process.

In some embodiments, the first etching process is an anisotropic etching process, and the second etching process is an isotropic etching process.

In some embodiments, the method further comprises forming a capacitor plug disposed over and electrically connected to the landing pad.

In some embodiments, the method further comprises forming a storage capacitor disposed over and electrically connected to the capacitor plug.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. The dimensions of the various features may be arbitrarily increased or reduced for clarity of discussion.

DETAILED DESCRIPTION

Figure 1A:
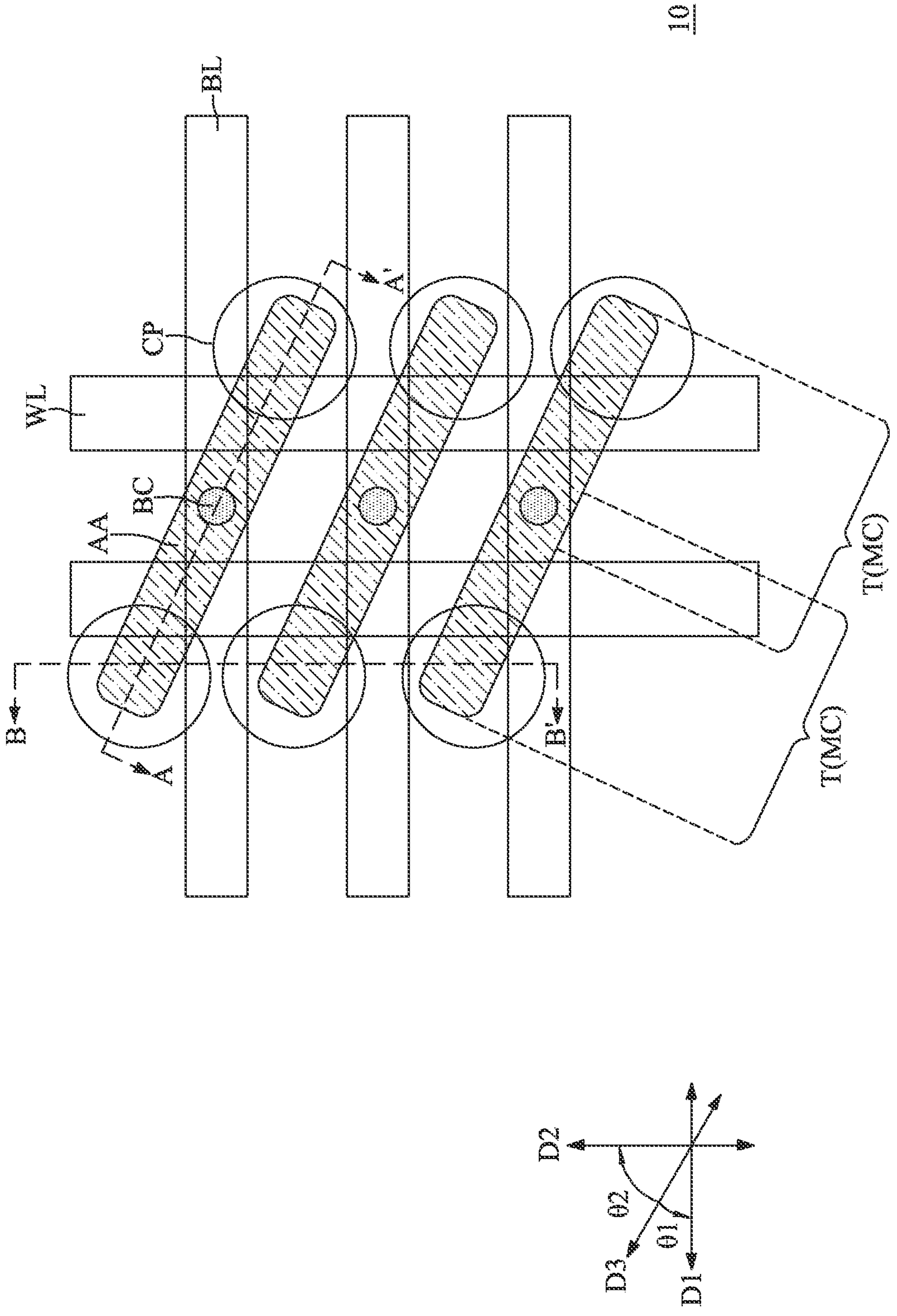
FIG. 1A is a schematic plan view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
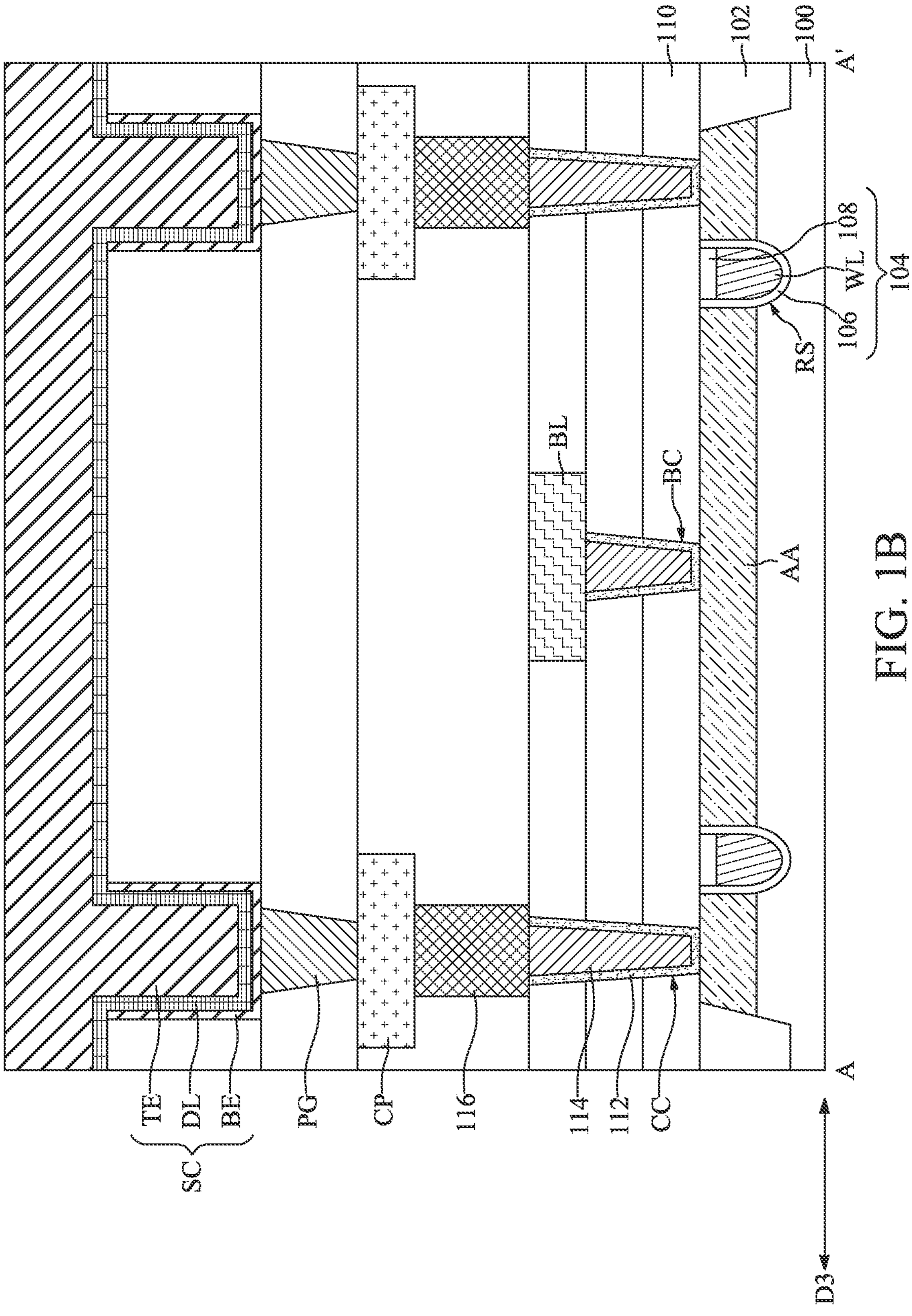
FIG. 1B is a schematic cross-sectional view along a line A-A' in FIG. 1A.
Figure 1C:
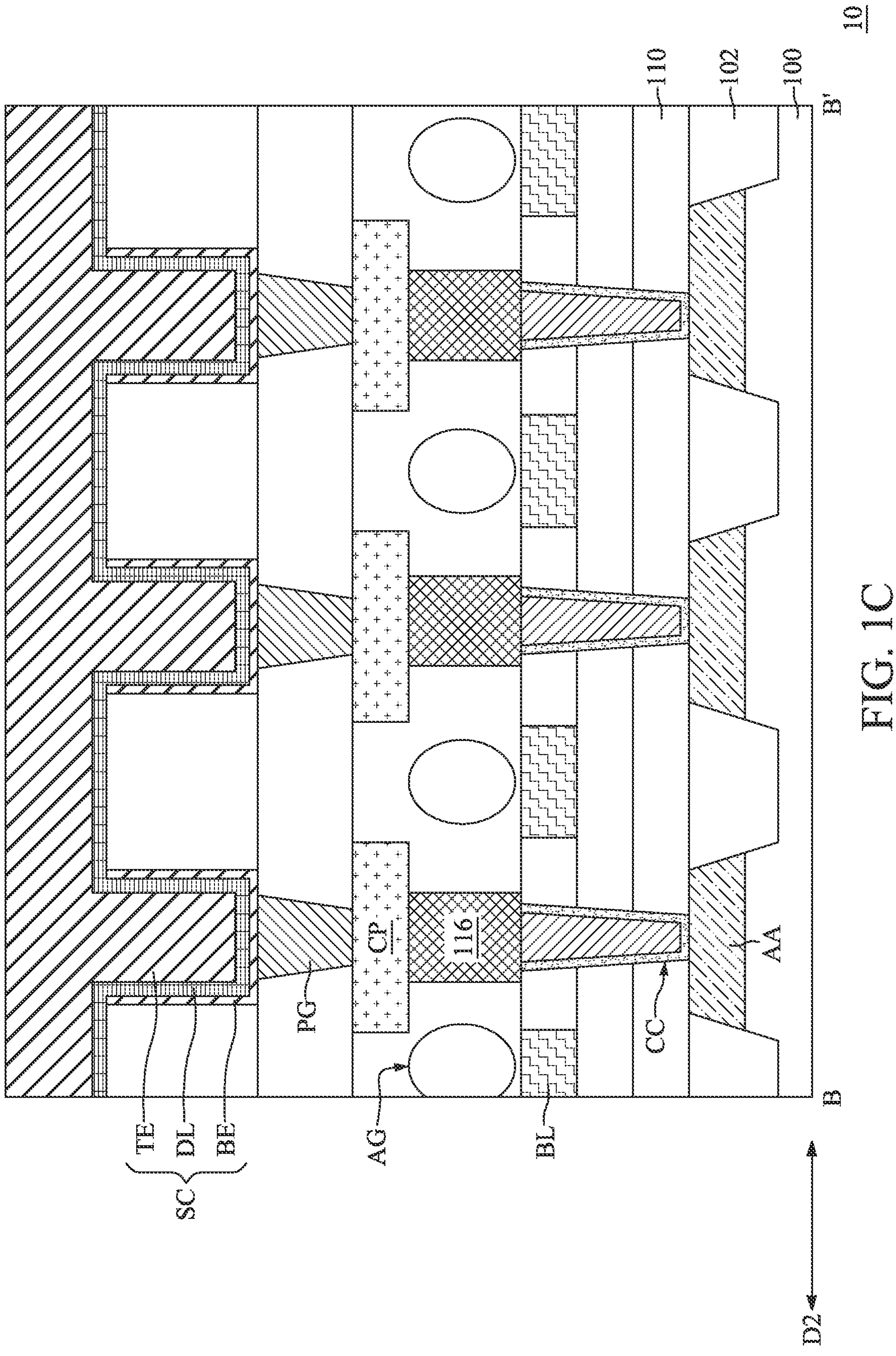
FIG. 1C is a schematic cross-sectional view along a line B-B' in FIG. 1A.

FIG. 1A is a schematic plan view of a semiconductor device 10 in accordance with some embodiments of the present disclosure. FIG. 1B is a schematic cross-sectional view along a line A-A' in FIG. 1A. FIG. 1C is a schematic cross-sectional view along a line B-B' shown in FIG. 1A. It should be noted that some elements shown in FIG. 1B and FIG. 1C (e.g., a substrate 100, an isolation structure 102, interlayer dielectric layers 110, capacitor contacts CC, conductive pillars 116, capacitor plugs PG, air gaps AG and a storage capacitor SC) are omitted from FIG. 1A.

Referring to FIG. 1A, in some embodiments, the semiconductor device 10 is a dynamic random-access memory (DRAM) device. The semiconductor device 10 includes an array of memory cells MC. It should be noted that, for conciseness, only two columns of memory cells MC are depicted in FIG. 1A. The array of memory cells MC includes active regions AA, word lines WL and bit lines BL. Each memory cell MC consists of a field-effect transistor T and the storage capacitor SC (not shown in FIG. 1A) connected to the field-effect transistor T. The field-effect transistor T is defined in the vicinity where one of the active regions AA intersects one of the word lines WL. A portion of the word line WL intersecting the active region AA functions as a gate terminal of the field-effect transistor T, and portions of the active region AA at opposite sides of the word line WL function as source and drain terminals of the field-effect transistor T. One of the source and drain terminals is electrically connected to one of the bit lines BL (e.g., through a bit line contact BC). In addition, other source and drain terminals are electrically connected to the storage capacitor SC (shown in FIG. 1B). In some embodiments, a landing pad CP is formed between the capacitor SC and the underlying source terminal or drain terminal of the field-effect transistor T. In addition, in some embodiments, each active region AA is shared by two of the memory cells MC. In such embodiments, each active region AA intersects two of the word lines WL, and the two field-effect transistors T sharing a same active region AA are connected by a common source or drain terminal, which is electrically connected to one of the bit lines BL.

The word lines WL extend along a direction D2, and the bit lines BL extend along a direction D1, wherein the direction D1 and the direction D2 are nonparallel. In some embodiments, the direction D1 is perpendicular to the direction D2. In addition, in some embodiments, the active regions AA extend along a direction D3, wherein the direction D1 and the direction D3 are nonparallel, and the direction D2 and the direction D3 are nonparallel. However, those skilled in the art can recognize that an angle θ1 between the directions D1 and D3, and an angle θ2 between the directions D2 and D3, can be adjusted according to design requirements, and the present disclosure is not limited thereto. In addition, those skilled in the art can recognize that the directions of the components shown in FIG. 1A may be rearranged based on process and design requirements, and the present disclosure is not limited thereto.

Referring to FIGS. 1A and 1B, the active region AA is a region of the substrate 100. The substrate 100 may be a semiconductor wafer or a semiconductor-on-insulator (SOI) wafer. For example, a material of the semiconductor wafer or the SOI wafer may include silicon. In some embodiments, the active region AA of the substrate 100 is a region doped with first conductive type (e.g., n-type) dopants or doped with second conductive type (e.g., p-type) dopants, wherein the second conductive type is complementary to the first conductive type. As discussed above, portions of each active region AA at opposite sides of the intersecting word line WL function as the source and drain terminals of the corresponding field-effect transistor T.

The active regions AA are electrically isolated from one another by the isolation structure 102. In some embodiments, the isolation structure 102 is formed in a recess at a surface of the substrate 100, and is made of an insulating material. In such embodiments, the isolation structure 102, which may also be referred to as a trench isolation structure, extends from the surface of the substrate 100 into the substrate 100. A depth of the isolation structure 102 may be greater than a depth of the active region AA, and the active regions AA are laterally separated from one another by the isolation structure 102. It should be noted that the isolation structure 102 extends between the active regions AA, and what appear in FIG. 1B to be multiple portions of the isolation structure 102 may actually be connected to one another.

In some embodiments, the word lines WL are formed in recess gate structures 104, respectively. The recess gate structures 104 extend along the direction D2 (shown in FIG. 1A) and intersect the active regions AA (as shown in FIG. 1B). In some embodiments, each active region AA intersects two of the recess gate structures 104. As shown in FIG. 1B, the recess gate structures 104 are respectively deposited in a recess RS at the surface of the substrate 100. A depth of the recess RS may be greater than the depth of the active region AA and may be greater than, equal to, or less than the depth of the isolation structure 102. In some embodiments, the recess gate structures 104 respectively include a gate dielectric layer 106, one of the word lines WL and an insulating capping layer 108. The gate dielectric layer 106 conformally covers a surface of the recess RS, and an inner surface of the gate dielectric layer 106 defines a recess corresponding to the recess RS of the substrate 100. The word line WL is deposited in the recess defined by the inner surface of the gate dielectric layer 106, to a height lower than the surface of the substrate 100. The insulating capping layer 108 covers a top surface of the word line WL and extends vertically to a height substantially aligned with the surface of the substrate 100. In other words, the recess defined by the inner surface of the gate dielectric layer 106 is filled by the word line WL and the insulating capping layer 108.

In some embodiments, the gate dielectric layer 106 is formed of a dielectric material. For example, the dielectric material may include silicon oxide or a high-k dielectric material having a dielectric constant greater than 3.9 (e.g., hafnium silicate, zirconium silicate, hafnium oxide, zirconium oxide or the like). In addition, in some embodiments, the word line WL may be made of polysilicon, a metal material (e.g., tungsten) or a metal silicide (e.g., nickel silicide, platinum silicide, titanium silicide, molybdenum silicide, cobalt silicide, tantalum silicide, tungsten silicide or the like). Further, in some embodiments, the insulating capping layer 108 may be made of an insulating material, such as silicon oxide, silicon nitride, silicon oxynitride, or the like.

A stack of the interlayer dielectric layers 110 is formed over the substrate 100, and the active regions AA, the isolation structure 102 and the recess gate structures 104 are covered by the interlayer dielectric layers 110. In addition, the bit line contacts BC and the capacitor contacts CC are formed in the stack of interlayer dielectric layers 110. The bit line contacts BC and the capacitor contacts CC respectively penetrate through bottommost ones of the interlayer dielectric layers 110, to establish electrical contact with the active regions AA. Each of the bit line contacts BC may be connected to a portion of the corresponding active region AA that is located between two of the word lines WL intersecting such active region AA. In other words, the bit line contacts BC are electrically connected to the common source/drain terminals of the transistors T (as shown in FIG. 1A). In contrast, the capacitor contacts CC are electrically connected to another source/drain terminal of each transistor T, such that each of the word lines WL is located between one of the bit line contacts BC and one of the capacitor contacts CC. The bit line contacts BC are electrically connected to the bit lines BL, while the capacitor contacts CC are electrically connected to storage capacitors (e.g., the storage capacitors SC, described below). In some embodiments, the bit lines BL are formed at a height lower than a height of the storage capacitors SC. In such embodiments, the bit line contacts BC may be shorter than the capacitor contacts CC, and top ends of the bit line contacts BC may be lower than top ends of the capacitor contacts CC. For example, the bit line contacts BC penetrate through two bottommost of the interlayer dielectric layers 110, while the capacitor contacts CC penetrate through three bottommost of the interlayer dielectric layers 110. Furthermore, in some embodiments, the bit line contacts BC and the capacitor contacts CC respectively include a conductive column 114 and a barrier layer 112 covering a sidewall and a bottom surface of the conductive column 114.

In some embodiments, the interlayer dielectric layers 110 may be made of a dielectric material. For example, the dielectric material may include silicon nitride, silicon oxide, silicon oxynitride, undoped silica glass, borosilica glass, phosphosilica glass, borophosphosilica glass, or a combination thereof. In addition, the conductive columns 114 of the bit line contacts BC and the capacitor contacts CC may be made of aluminum, copper, tungsten, cobalt, another suitable metal or a metal alloy, and the barrier layer 112 of the bit line contacts BC and the capacitor contacts CC may be made of, for example, tungsten nitride.

The bit lines BL cover and electrically connect to the bit line contacts BC. Although not shown, each of the bit lines BL may cover the bit line contacts BC electrically connected to a row of transistors T, and each of the bit lines BL may extend along the direction D1. As shown in FIG. 1B, the bit lines BL may be formed in one of the interlayer dielectric layers 110 above the bit line contacts BC. In some embodiments, topmost portions of the capacitor contacts CC and the bit lines BL are located in a same interlayer dielectric layer 110. In such embodiments, top surfaces of the bit lines BL may be substantially coplanar with top surfaces of the capacitor contacts CC. In alternative embodiments, the bit line contacts BC are much shorter than the capacitor contacts CC, and the top surfaces of the bit lines BL may be lower than the top surfaces of the capacitor contacts CC. In addition, in some embodiments, the bit lines BL are made of a conductive material. For example, the conductive material may include aluminum, copper, tungsten, cobalt, other suitable metals, or metal alloys.

Referring to FIGS. 1B and 1C, the conductive pillars 116 and the landing pads CP are disposed on the capacitor contacts CC. Each of the conductive pillars 116 stands on one of the capacitor contacts CC, and is covered by one of the landing pads CP. A vertical height of the conductive pillar 116 may be greater than a vertical height (or a thickness) of the landing pad CP. In some embodiments, a sidewall of each conductive pillar 116 is laterally recessed from a sidewall of the overlying landing pad CP. In such embodiments, each conductive pillar 116 has a footprint area smaller than a footprint area of the corresponding landing pad CP. In addition, the conductive pillars 116 may be entirely overlapped by the landing pads CP. The conductive pillars 116 and the landing pads CP may be formed in a same interlayer dielectric layer 110 covering the capacitor contacts CC. In embodiments where the top surfaces of the bit lines BL are coplanar with or lower than the top surfaces of the capacitor contacts CC, the bit lines BL are also disposed below the conductive pillars 116 and the landing pads CP. As shown in FIG. 1C, a distance between adjacent landing pads CP is less than a distance between adjacent conductive pillars 116. As a consequence, when the interlayer dielectric layer 110 is deposited in the spaces between the adjacent landing pads CP and the spaces between the adjacent conductive pillars 116, the smaller spaces between the adjacent landing pads CP may be filled sooner than the larger spaces between the adjacent conductive pillars 116. Accordingly, air gaps AG may be formed and sealed in the larger spaces (i.e., in the spaces between the adjacent conductive pillars 116). In some embodiments, the air gaps AG may not expose sidewalls of the conductive pillars 116, and may not expose the top surfaces of the underlying bit lines BL. However, in alternative embodiments, at least some portions of the sidewalls of the conductive pillars 116 and/or at least some portions of the top surfaces of the bit lines BL are exposed by the air gaps AG. In addition, in certain embodiments, top ends of the air gaps AG may extend to the spaces between the landing pads CP. Further, although the air gaps AG are depicted as oval shapes in FIG. 1C, the air gaps AG can be formed into other shapes, and the present disclosure is not limited thereto.

The landing pads CP and the conductive pillars 116 are made of different conductive materials. In some embodiments, a resistivity of the conductive material for forming the landing pads CP is less than a resistivity of the conductive material for forming the conductive pillars 116, and the conductive material for forming the conductive pillars 116 has a sufficient etching selectivity with respect to the conductive material.

The landing pads CP and the conductive pillars 116 may each be formed by an etching process. In some embodiments, the landing pads CP may be formed by a first etching process. In some embodiments, the conductive pillars 116 may be formed by a second etching process that follows the first etching process.

In some embodiments, the capacitor plugs PG stand on the landing pads CP, respectively. The capacitor plugs PG may be formed in one of the interlayer dielectric layers 110 covering the landing pads CP. Since each of the landing pads CP has a footprint area greater than a footprint area of the underlying conductive pillar 116, connection between the capacitor plugs PG and the conductive pillars 116 can be established even when the capacitor plugs PG are offset from the conductive pillars 116. In other words, due to the landing pads CP, electrical connection between the capacitor plugs PG and the conductive pillars 116 can be ensured. In addition, as described above, the air gaps AG can be formed as a result of disposing the landing pads CP. The capacitor plugs PG are made of a conductive material. For example, such conductive material may include aluminum, copper, tungsten, cobalt, and other suitable metals or metal alloys.

The storage capacitors SC are disposed on and electrically connected to the capacitor plugs PG, respectively. In some embodiments, the interlayer dielectric layer 110 above the capacitor plugs PG may have openings overlapping the capacitor plugs PG, and the storage capacitor SC may fill the openings and may cover a top surface of the interlayer dielectric layer 110. The storage capacitors SC may include bottom electrodes BE, a dielectric layer DL and a top electrode TE. The bottom electrodes BE conformally cover a sidewall and a bottom surface of each opening in the interlayer dielectric layer 110 above the capacitor plugs PG. The bottom electrodes BE are separated from one another, and are respectively in electrical connection with one of the capacitor plugs PG. The dielectric layer DL conformally covers surfaces of the bottom electrodes BE and the top surface of the interlayer dielectric layer 110 in which the bottom electrodes BE are disposed. The top electrode TE fills the openings of the aforementioned interlayer dielectric layer 110 and may extend onto a topmost surface of the interlayer dielectric layer 110. In the embodiments described above, the dielectric layer DL and the top electrode TE are shared by the storage capacitors SC (i.e., the dielectric layer DL and the top electrode TE extend across multiple storage capacitors SC). The bottom electrodes BE and the top electrode TE are respectively made of a conductive material, while the dielectric layer DL may be made of a high-k dielectric material. For example, the conductive material for forming the bottom electrodes BE may include doped polysilicon, metal silicide, aluminum, copper or tungsten, while the conductive material for forming the top electrode TE may include doped polysilicon, copper, or aluminum. In addition, the high-k dielectric material for forming the dielectric layer DL may include barium strontium titanate, lead zirconium titanate, titanium oxide, aluminum oxide, hafnium oxide, yttrium oxide, zirconium oxide or the like.

Referring to FIGS. 1A to 1C, in some embodiments, the storage capacitors SC are electrically connected to the transistors T through the capacitor plugs PG, the landing pads CP, the conductive pillars 116 and the capacitor contacts CC. As shown in FIGS. 1A and 1C, as a size of each memory cell MC decreases, a distance between adjacent memory cells MC along the direction D2 may also be reduced. As a consequence, parasitic capacitance between adjacent conductive pillars 116 is increased, and such an increase in parasitic capacitance results in greater resistance-capacitance (RC) delay of the semiconductor device 10. As described above, by forming the landing pads CP to each be larger than the underlying conductive pillar 116, the air gaps AG can be formed between adjacent conductive pillars 116. Air sealed in the air gaps AG has a dielectric constant of approximately 1, which is significantly less than a dielectric constant of a solid dielectric material (i.e., the dielectric material for forming the interlayer dielectric layers 110). Therefore, the parasitic capacitance between the conductive pillars 116 can be reduced by the formation of the air gaps AG, and the RC delay of the semiconductor device 10 can be effectively reduced.

Figure 1D:
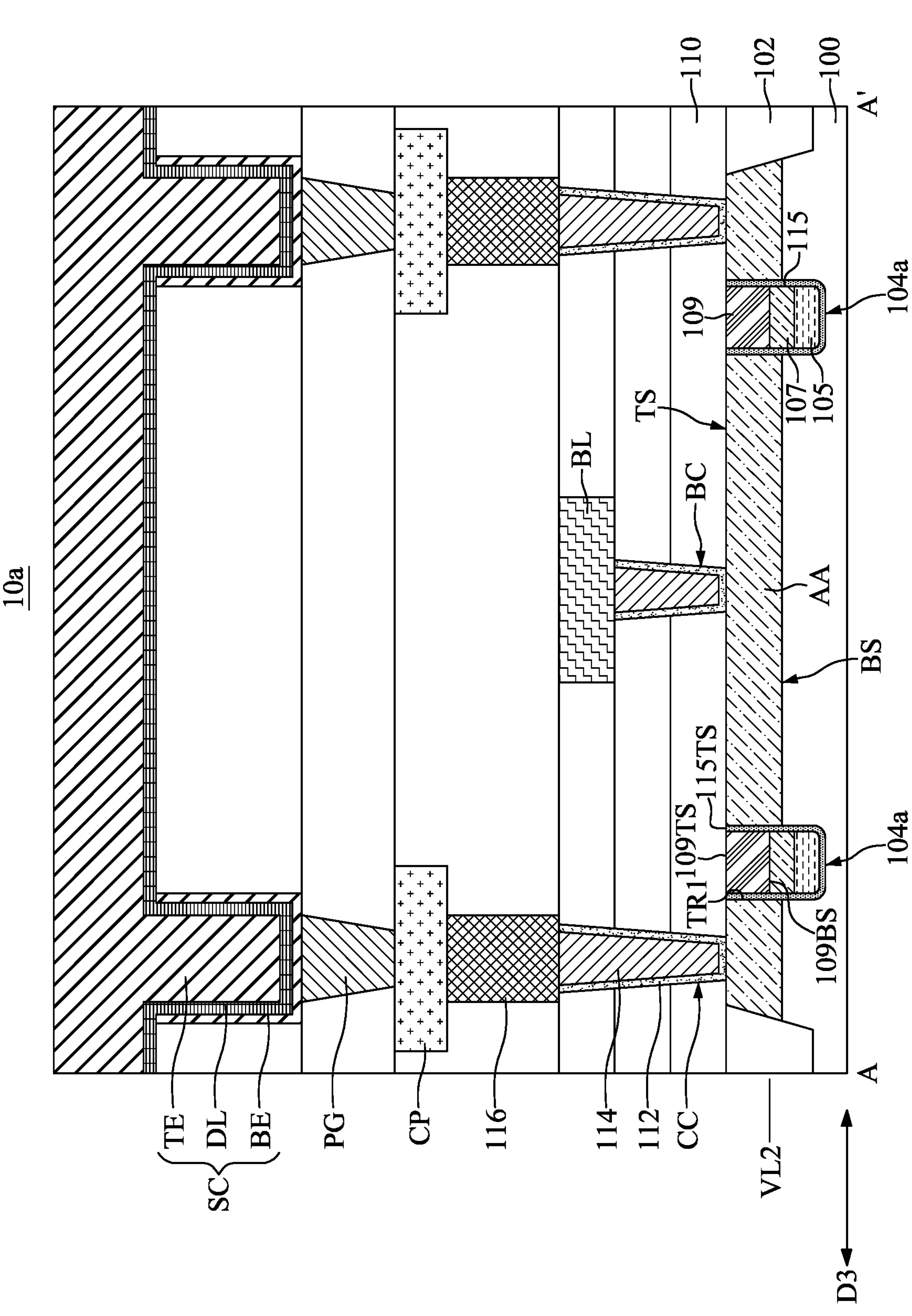
FIG. 1D is a schematic cross-sectional view of a semiconductor device in accordance with alternative embodiments of the present disclosure.

FIG. 1D is a schematic cross-sectional view of a semiconductor device **10*a* in accordance with alternative embodiments of the present disclosure. The semiconductor device 10*a* is similar to the semiconductor device 10** in many aspects, and description of similar features will not be repeated herein.

Referring to FIG. 1D, the semiconductor device **10*a* includes recess gate structures 104*a*. Each of the recess gate structures 104*a* comprises a gate insulating layer 115, a work function layer 105, a first conductive layer 107, and a capping layer 109**.

In some embodiments, the gate insulating layer 115 is conformally formed in a trench TR1 disposed in the substrate 100. A top surface 115TS of the gate insulating layer 115 is substantially coplanar with a top surface TS of the substrate 100. The gate insulating layer 115 may have a thickness in a range of about 1 nm to about 7 nm, including about 1 nm, about 2 nm, about 3 nm, about 4 nm, about 5 nm, about 6 nm, or about 7 nm. In some embodiments, the gate insulating layer 115 may be formed by a thermal oxidation process. For example, the gate insulating layer 115 may be formed by oxidizing a surface of the trench TR1. In some embodiments, the gate insulating layer 115 may be formed by a deposition process such as a chemical vapor deposition or an atomic layer deposition. The gate insulating layer 115 may include a high-k material, an oxide, a nitride, an oxynitride, or a combination thereof.

In some embodiments, the work function layer 105 may be formed on the gate insulating layer 115 and in the trench TR1. The work function layer 105 may be formed by a deposition process and a subsequent etch-back process. In some embodiments, the work function layer 105 may be formed of, for example, doped polycrystalline silicon, doped polycrystalline germanium, or doped polycrystalline silicon germanium. In some embodiments, the work function layer 105 may include silicon and/or germanium with substantially no oxygen and no nitrogen. As used in this regard, a feature with "substantially no oxygen and no nitrogen" has less than 2%, less than 1% or less than 0.5% oxygen, and less than 2%, less than 1% or less than 0.5% nitrogen on an atomic basis. In some embodiments, the work function layer 105 may consist essentially of silicon, germanium, or silicon germanium. As used herein, "consist essentially of" with respect to the composition of a layer means that the stated elements compose greater than 95%, greater than 98%, greater than 99% or greater than 99.5% of the stated material on an atomic basis. In some embodiments, the work function layer 105 may be formed of a material having etching selectivity to the substrate 100.

In some embodiments, the first conductive layer 107 may be formed on the work function layer 105 and in the trench TR1. In some embodiments, the first conductive layer 107 may be formed of, for example, germanium. In some embodiments, the first conductive layer 107 may include an atomic percentage of germanium greater than or equal to 50%. In some embodiments, the first conductive layer 107 may be formed by a deposition process. In some embodiments, the deposition process may include a reactive gas including a germanium precursor and/or hydrogen gas.

In some embodiments, the capping layer 109 may be formed on the first conductive layer 107 and in the trench TR1. In some embodiments, a top surface 109TS of the capping layer 109 and the top surface 115TS of the gate insulating layer 115 may be substantially coplanar. In some embodiments, a bottom surface 109BS of the capping layer 109 may be at a vertical level VL2 higher than a bottom surface BS of the active regions AA. In some embodiments, the capping layer 109 is formed of germanium oxide. In some embodiments, the capping layer 109 may be formed by, for example, chemical vapor deposition, atomic layer deposition, or another applicable deposition process.

Figure 1E:
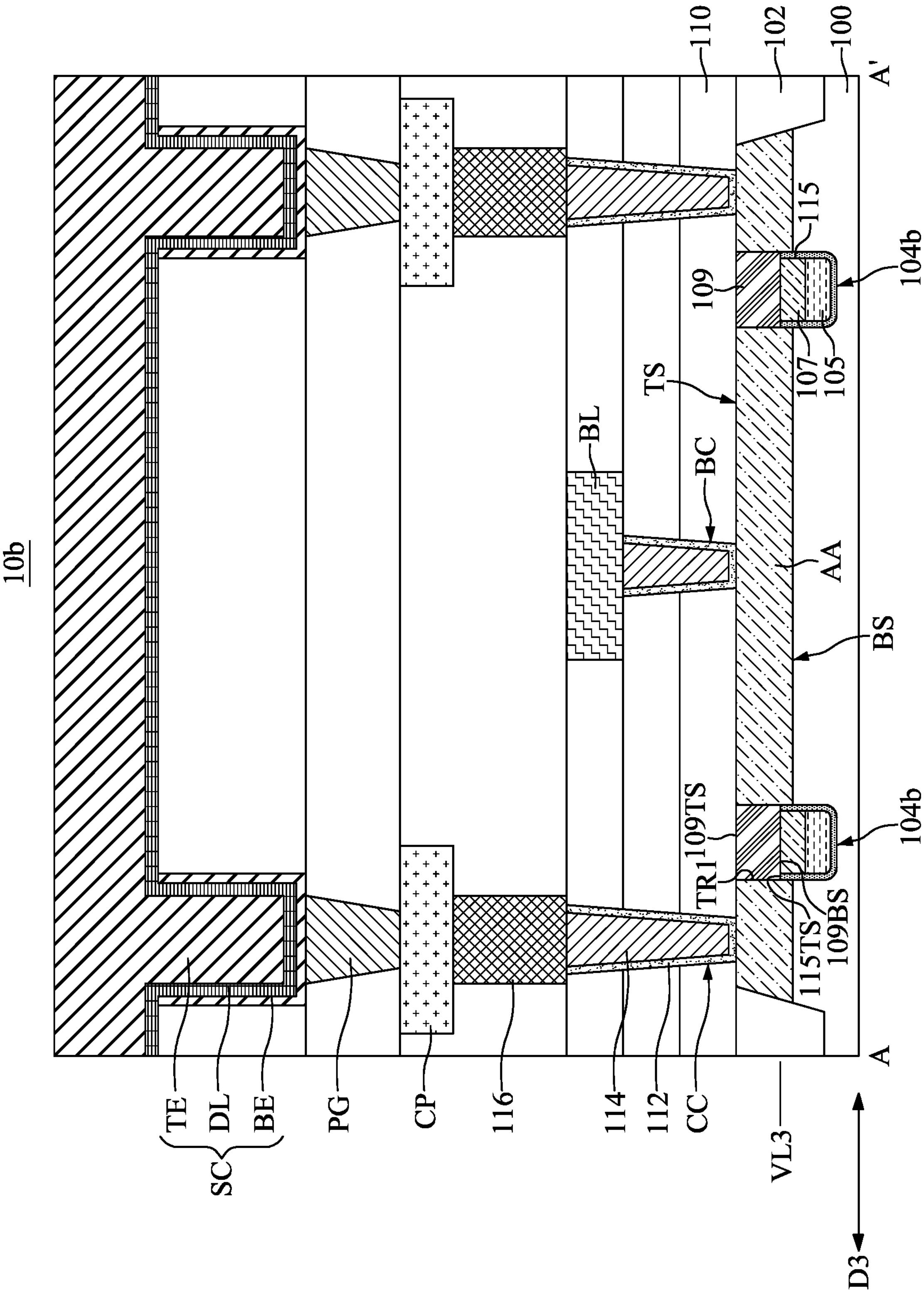
FIG. 1E is a schematic cross-sectional view of a semiconductor device in accordance with alternative embodiments of the present disclosure.

FIG. 1E is a schematic cross-sectional view of a semiconductor device **10*b* in accordance with alternative embodiments of the present disclosure. The semiconductor device 10*b* may have a structure similar to that illustrated in FIG. 1D. Elements in FIG. 1E that are same as or similar to elements in FIG. 1**D are indicated with similar reference numbers and duplicative descriptions are omitted.

Referring to FIG. 1E, the semiconductor device **10*b* includes recess gate structures 104*b*. Each of the recess gate structures 104*b* comprises a gate insulating layer 115, a work function layer 105, a first conductive layer 107, and a capping layer 109. A top surface 115TS of the gate insulating layer 115 may be at a vertical level VL3 higher than a bottom surface BS of the active region AA. In some embodiments, the top surface 115TS of the gate insulating layer 115 and a bottom surface 109BS of the capping layer 109 may be substantially coplanar. In some embodiments, the top surface 115TS of the gate insulating layer 115 may not be substantially coplanar with the bottom surface 109BS of the capping layer 109**.

Figure 1F:
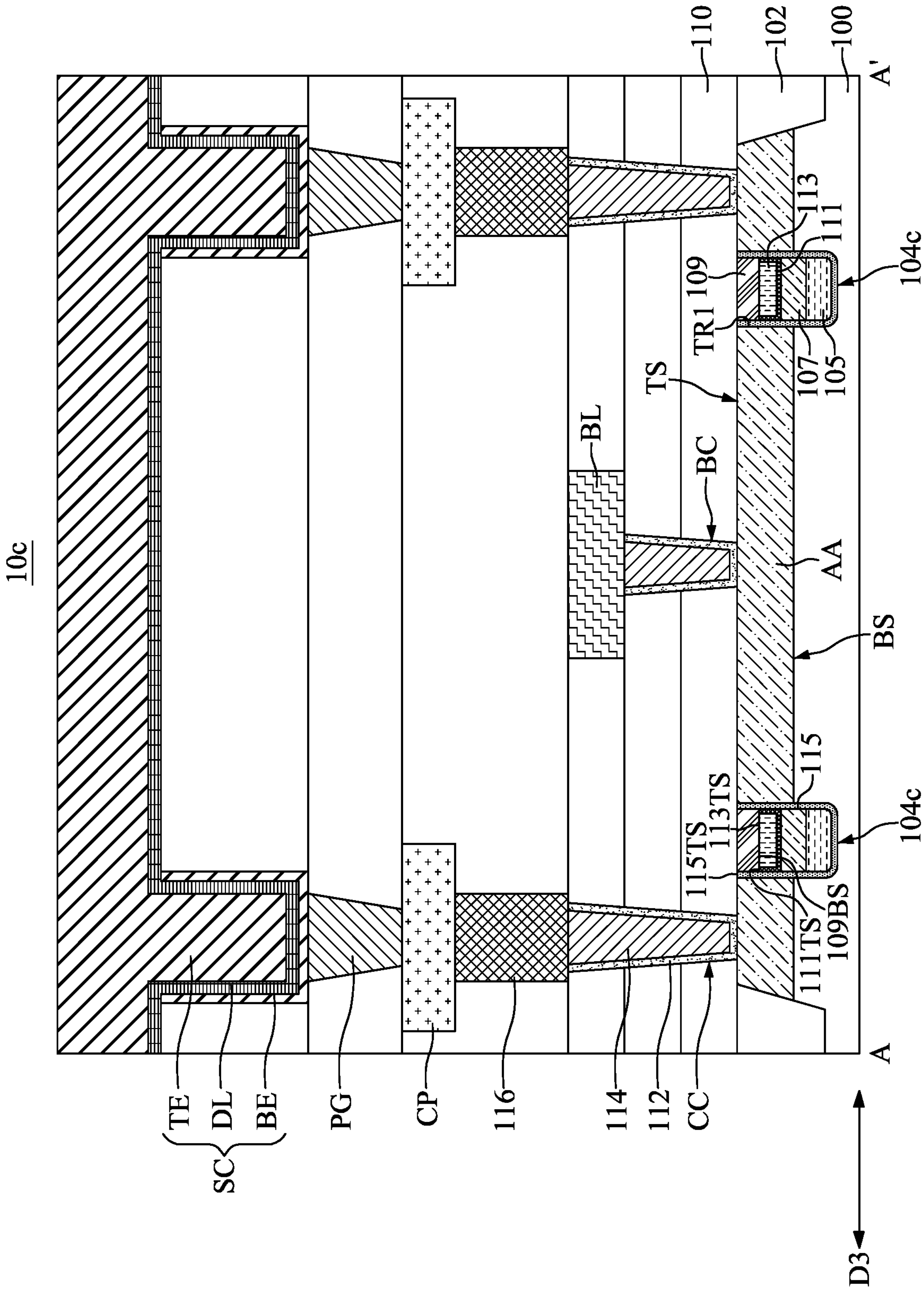
FIG. 1F is a schematic cross-sectional view of a semiconductor device in accordance with alternative embodiments of the present disclosure.

FIG. 1F is a schematic cross-sectional view of a semiconductor device 10*c* in accordance with alternative embodiments of the present disclosure. The semiconductor device 10*c* may have a structure similar to that illustrated in FIG. 1D. Elements in FIG. 1F that are same as or similar to elements in FIG. 1D are indicated with similar reference numbers and duplicative descriptions are omitted.

Referring to FIG. 1F, the semiconductor device 10*c* includes recess gate structures 104*c*. Each of the recess gate structures 104*c* comprises a gate insulating layer 115, a work function layer 105, a first conductive layer 107, a liner layer 111, a second conductive layer 113, and a capping layer 109.

In some embodiments, the liner layer 111 may be conformally disposed on the first conductive layer 107 and the gate insulating layer 115, and disposed between the capping layer 109 and the first conductive layer 107. The liner layer 111 may have a U-shaped cross-sectional profile. A top surface 111TS of the liner layer 111 may be substantially coplanar with a bottom surface 109BS of the capping layer 109. The second conductive layer 113 may be disposed between the capping layer 109 and the liner layer 111. A top surface 113TS of the second conductive layer 113 and the bottom surface 109BS of the capping layer 109 may be substantially coplanar.

In some embodiments, the liner layer 111 may be formed of a material having an etching selectivity to the gate insulating layer 115. In some embodiments, the liner layer 111 may be formed of a material having an etching selectivity to the first conductive layer 107. In some embodiments, the liner layer 111 may be formed of a material having an etching selectivity to the substrate 100. In some embodiments, the liner layer 111 may be formed of, for example, a material including $sp^2$ hybridized carbon atoms. In some embodiments, the liner layer 111 may be formed of, for example, a material including carbons having hexagonal crystal structures. In some embodiments, the liner layer 111 may be formed of, for example, graphene, graphite, or the like.

In some embodiments, the liner layer 111 may be formed on a catalyst substrate and then transferred onto the first conductive layer 107. The catalyst substrate may include nickel, copper, cobalt, platinum, silver, ruthenium, iridium, palladium, an alloy of iron and nickel, an alloy of copper and nickel, an alloy of nickel and molybdenum, an alloy of gold and nickel, or an alloy of cobalt and copper.

In some embodiments, the second conductive layer 113 may be formed of, for example, molybdenum. In some embodiments, the second conductive layer 113 may be formed by a chemical vapor deposition process. For example, an intermediate semiconductor device to be deposited may be exposed to a molybdenum precursor and a reactant. In some embodiments, the reactant may flow continuously and a flow of the molybdenum precursor to the chamber may be turned on and off.

In some embodiments, the molybdenum precursor may include a molybdenum halide. In some embodiments, the molybdenum halide may include molybdenum fluoride, molybdenum chloride, or combinations thereof. In some embodiments, the molybdenum precursor may be flowed using a carrier gas over the intermediate semiconductor device to be deposited. In some embodiments, the carrier gas may flow through an ampoule including the molybdenum precursor. In some embodiments, the carrier gas may be an inert gas. In some embodiments, the inert gas may include one or more of $N_2$, Ar, and He.

Figure 1G:
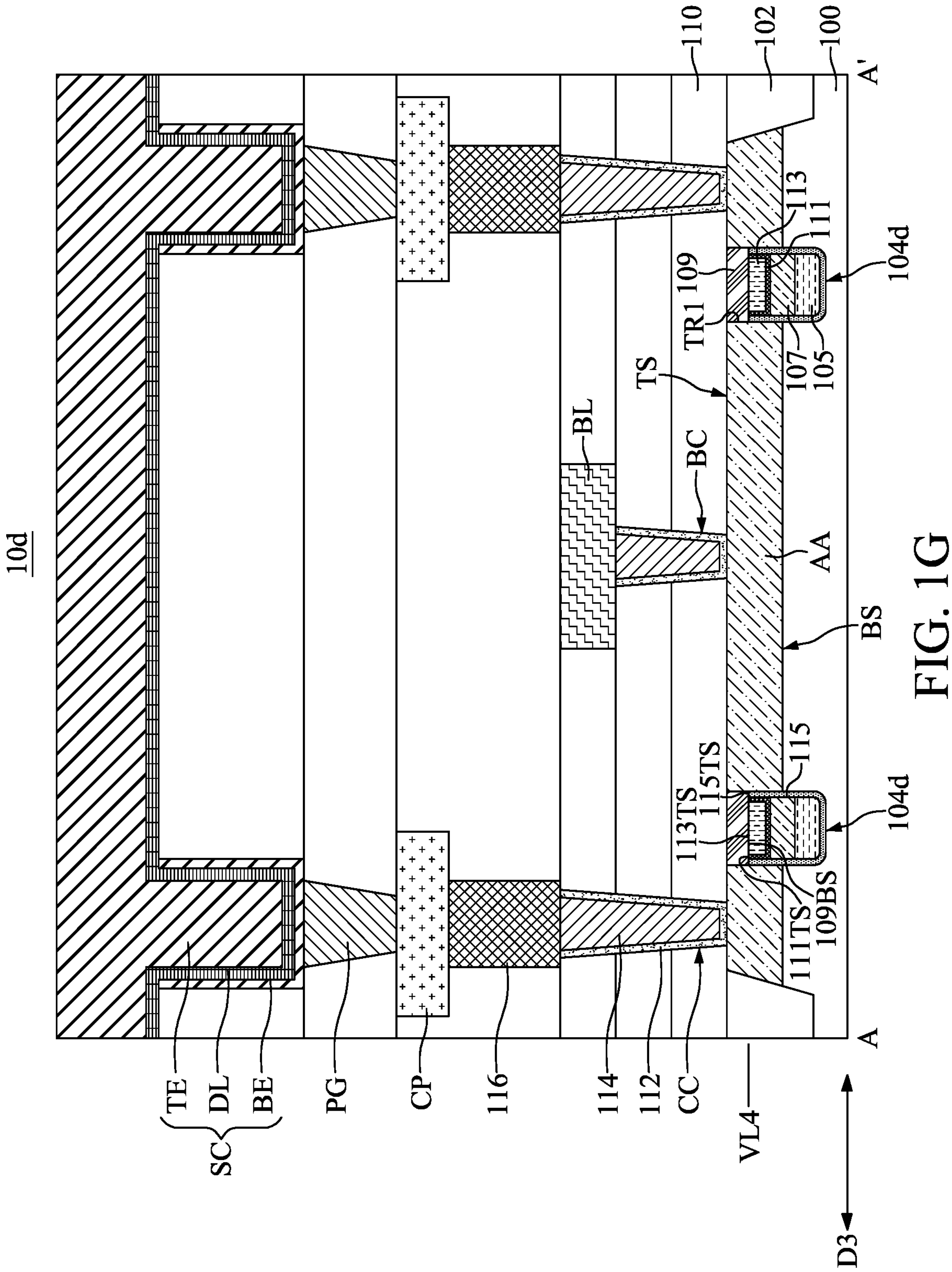
FIG. 1G is a schematic cross-sectional view of a semiconductor device in accordance with alternative embodiments of the present disclosure.

FIG. 1G is a schematic cross-sectional view of a semiconductor device 10*d* in accordance with alternative embodiments of the present disclosure. The semiconductor device 10*d* may have a structure similar to that illustrated in FIG. 1F. Elements in FIG. 1G that are same as or similar to elements in FIG. 1F are indicated with similar reference numbers and duplicative descriptions are omitted.

Referring to FIG. 1G, the semiconductor device 10*d* includes recess gate structures 104*d*. Each of the recess gate structures 104*d* comprises a gate insulating layer 115, a work function layer 105, a first conductive layer 107, a liner layer 111, a second conductive layer 113, and a capping layer 109.

In some embodiments, a top surface 115TS of the gate insulating layer 115 may be at a vertical level VL4 higher than a bottom surface BS of the active region AA. In some embodiments, the top surface 115TS of the gate insulating layer 115 and the bottom surface 109BS of the capping layer 109 may be substantially coplanar. In some embodiments, the top surface 115TS of the gate insulating layer 115 may not be substantially coplanar with the bottom surface 109BS of the capping layer 109. In some embodiments, the top surface 115TS of the gate insulating layer 115, a top surface 111TS of the liner layer 111, and a top surface 113TS of the second conductive layer 113 may be substantially coplanar.

Figure 1H:
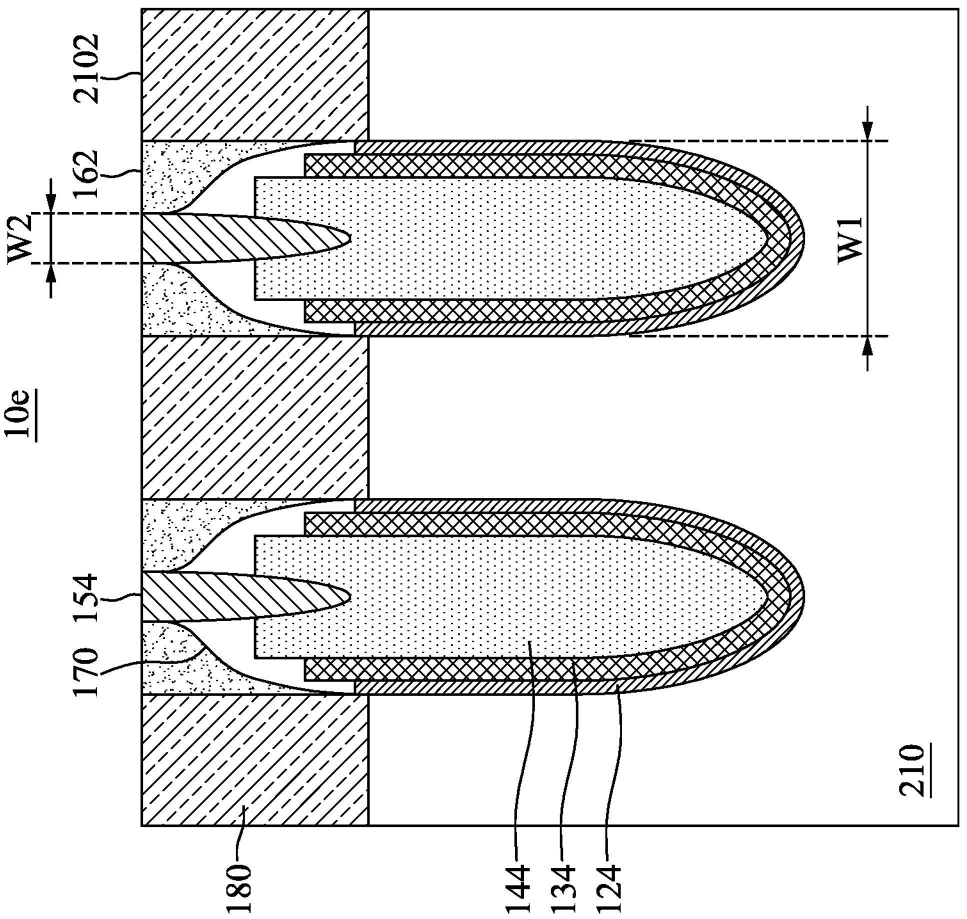
FIG. 1H is a schematic cross-sectional view of a semiconductor device in accordance with alternative embodiments of the present disclosure.

FIG. 1H is a schematic cross-sectional view of a semiconductor device 10*e* in accordance with alternative embodiments of the present disclosure.

Referring to FIG. 1H, the semiconductor device 10*e* is a recessed access device (RAD) transistor including a substrate 210, a plurality of word lines 144 disposed in the substrate 210 and surrounded by dielectric liners 124, a plurality of insulative plugs 154 disposed in the substrate 210 and extending into the word lines 144, respectively, and a plurality of impurity regions 180 disposed in the substrate 210 and on either side of the word lines 144, wherein the impurity regions 180 serve as source/drain regions of the RAD transistor. The dielectric liners 124, between the substrate 210 and the word lines 144, are employed to prevent junction leakage. In addition, the dielectric liners 124 can prevent dopants introduced in the impurity regions 180 from migrating into the word lines 144.

The semiconductor device 10*e* further includes an isolation layer 162 disposed in the substrate 210 and employed to cap the word lines 144. In some embodiments, the isolation layer 162 is made of germanium oxide. With high integration of the semiconductor device 10*e*, a distance between the word lines 144 may be reduced. This may increase parasitic capacitance between the word lines 144, and performance of the semiconductor device 10*e* may be degraded. Therefore, a plurality of voids 170 that typically hold air, which has a dielectric constant or k value of about 1, can be introduced in the isolation layer 162 to reduce the parasitic capacitance. Thus, a leakage current in the highly integrated semiconductor device 10*e* may be further reduced, thereby improving the performance of the semiconductor device 10*e*.

In some embodiments, the void 170, buried in the isolation layer 162, extends around a perimeter of the insulative plug 154. In some embodiments, the void 170 can separate at least a portion of the word line 144 from the isolation layer 162. In some embodiments, the isolation layer 162 capping the word line 144 may include a plurality of voids 170 having a low dielectric constant to reduce the parasitic capacitance. In some embodiments, the insulative plug 154 and the isolation layer 162 can include a same dielectric material if one or more voids 170 are buried in the isolation layer 162. In alternative embodiments, the insulative plug 154 and the isolation layer 162 may include different dielectric materials; the isolation layer 162 can have a first dielectric constant, and the insulative plug 154 can have a second dielectric constant less than the first dielectric constant to further reduce the parasitic capacitance.

As shown in FIG. 1H, the word line 144, below an upper surface 2102 of the substrate 210, and the insulative plug 154 embedded in the word line 144 are concentric. In some embodiments, the word line 144 has a first width W1 (e.g., a top or maximum width), and the insulative plug 154 has a second width W2 (e.g., a top or maximum width) less than the first width W1. In some embodiments, the first width W1 and the second width W2 gradually decrease at positions of increasing distance from the upper surface 2102 of the substrate 210. In some embodiments, the word line 144 is made of germanium. In some embodiments, the semiconductor device 10*e* may also include a plurality of diffusion barrier liners 134 disposed between the dielectric liners 124 and the word lines 144. The diffusion barrier liners 134 are employed to prevent the word lines 144 from flaking or spalling from the dielectric liners 124.

During manufacturing, a method for manufacturing the semiconductor device 10*e* may comprise: creating at least one trench in the substrate 210; depositing a conductive material of the word line 144 to partially fill the trench; forming an insulative piece of the insulative plug 154 in the trench, wherein the insulative piece extends into the conductive material; and depositing an isolation material of the isolation layer 162 in the trench to cap the conductive material exposed through the insulative piece, wherein the depositing of the isolation material further comprises enclosing at least one void 170 in the isolation material.

Figure 2:
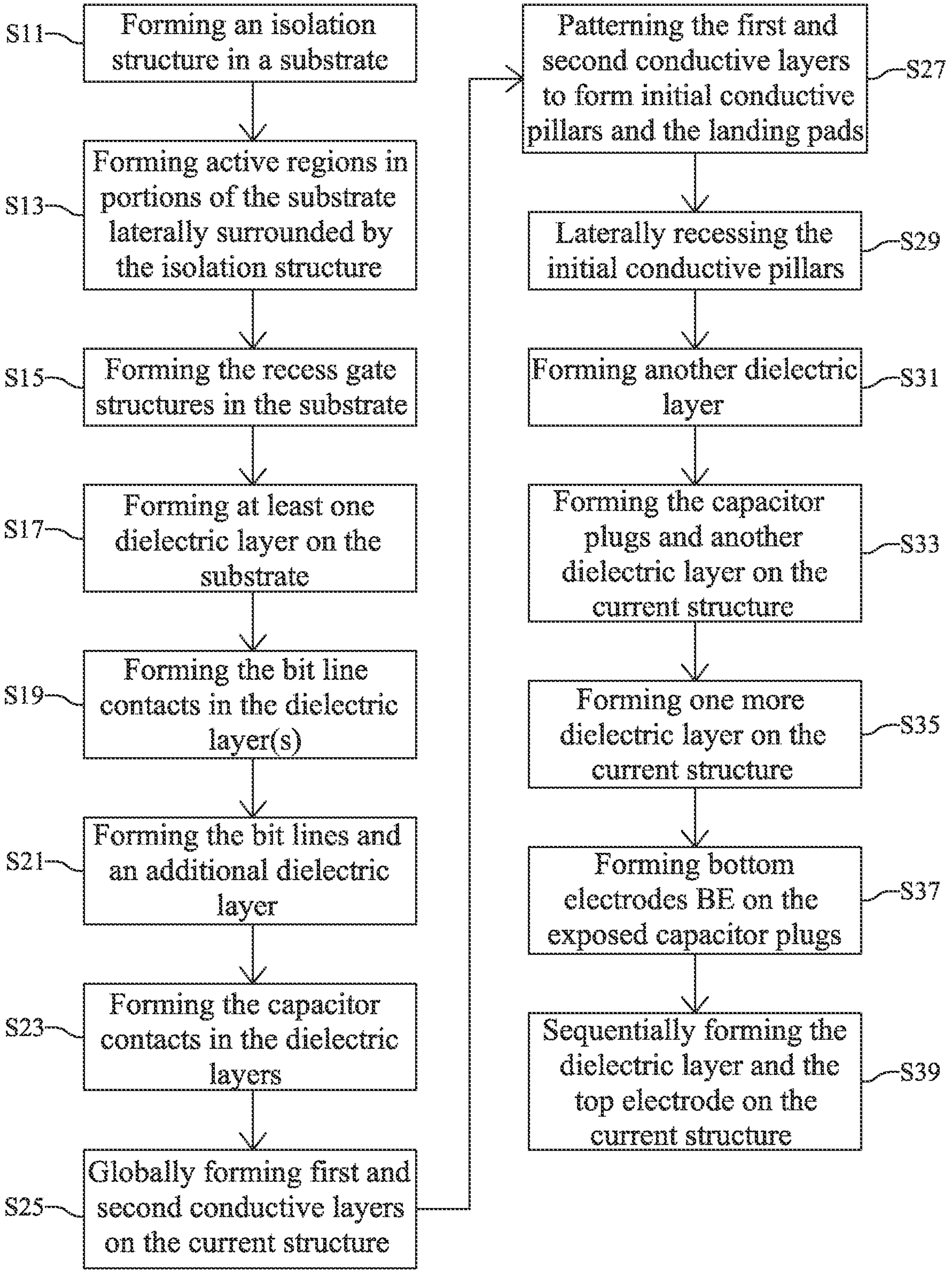
FIG. 2 is a flow diagram illustrating a manufacturing method of a semiconductor device in accordance with some embodiments of the present disclosure.
Figure 3A:
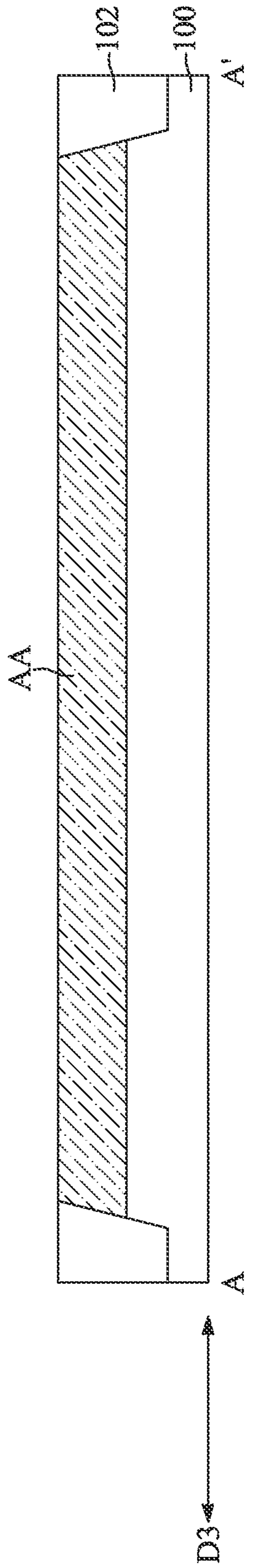
FIGS. 3A to 3N are schematic cross-sectional views of intermediate structures of the semiconductor device in accordance with the method in FIG. 2.

FIG. 2 is a flow diagram illustrating a manufacturing method of the semiconductor device 10 shown in FIGS. 1A to 1C. FIGS. 3A to 3N are schematic cross-sectional views along one of the active regions AA (e.g., along the line A-A' shown in FIG. 1A) in the structures at various stages during the manufacturing of the semiconductor device 10. FIGS. 3O to 3R are schematic cross-sectional views of alternative intermediate structures in step S15 of the method in FIG. 2 in accordance with alternative embodiments of the present disclosure. FIG. 4 is another schematic cross-sectional view (along the line B-B' shown in FIG. 1B) of the structure at the stage illustrated in FIG. 3J.

Referring to FIGS. 2 and 3A, step S11 is performed, wherein the isolation structure 102 is formed in the substrate 100. The isolation structure 102 defines portions of the substrate 100 to be formed as the active regions AA. In some embodiments, the isolation structure 102 is a trench isolation structure. In such embodiments, a method for forming the isolation structure 102 may include forming a trench at a surface of the substrate 100 by a lithography process and an etching process (e.g., an anisotropic etching process), and depositing an insulating material into the trench. Next, a planarization process may be performed to remove portions of the insulating material above the substrate 10. A remaining portion of the insulating material forms the isolation structure 102. For example, the planarization process described in the present disclosure may include a chemical mechanical polishing (CMP) process, an etching process, or a combination thereof.

Next, step S13 is performed, wherein the active regions AA are formed in the portions of the substrate 100 laterally surrounded by the isolation structure 102. In some embodiments, the active regions AA are formed by an ion implantation process, during which n-type or p-type dopants are implanted into the substrate 100. In such embodiments, the isolation structure 102 may function as a mask during the ion implantation process.

Figure 3B:
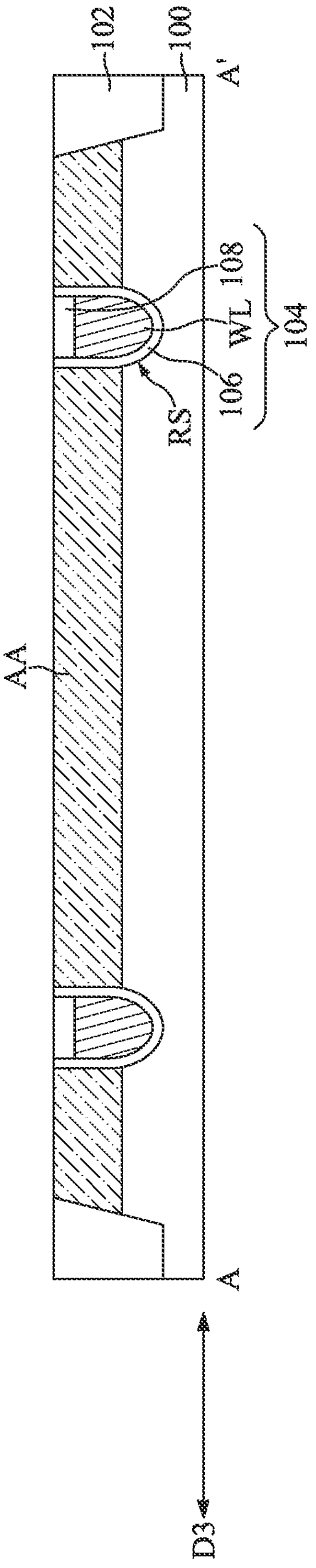
FIGS. 3O to 3R are schematic cross-sectional views of intermediate structures of the semiconductor device at the stage illustrated in step S15 of the method in FIG. 2 in accordance with alternative embodiments of the present disclosure.

Referring to FIGS. 2 and 3B, step S15 is performed, wherein the recess gate structures 104 are formed in the substrate 100. As described with reference to FIGS. 1A and 1B, the recess gate structures 104 may be respectively formed in a line shape, wherein the line intersects the active regions AA. In addition, the recess gate structures 104 may respectively include the gate dielectric layer 106, the word line WL, and the insulating capping layer 108. In some embodiments, a method for forming the recess gate structures 104 may include forming the recesses RS at the surface of the substrate 100 using a lithography process and an etching process (e.g., an anisotropic etching process). Next, the gate dielectric layers 106 may be conformally formed in the recesses RS by an oxidation process or a deposition process (e.g., a chemical vapor deposition (CVD) process). A conductive material is subsequently deposited in the recesses RS by a deposition process (e.g., a CVD process or a physical vapor deposition (PVD) process), and is etched back to form the word lines WL. Next, an insulating material is deposited in the recesses RS by a deposition process (e.g., a CVD process), and portions of the insulating material above the substrate 100 may be removed by a planarization process, so as to form the insulating capping layers 108.

Figure 3C:
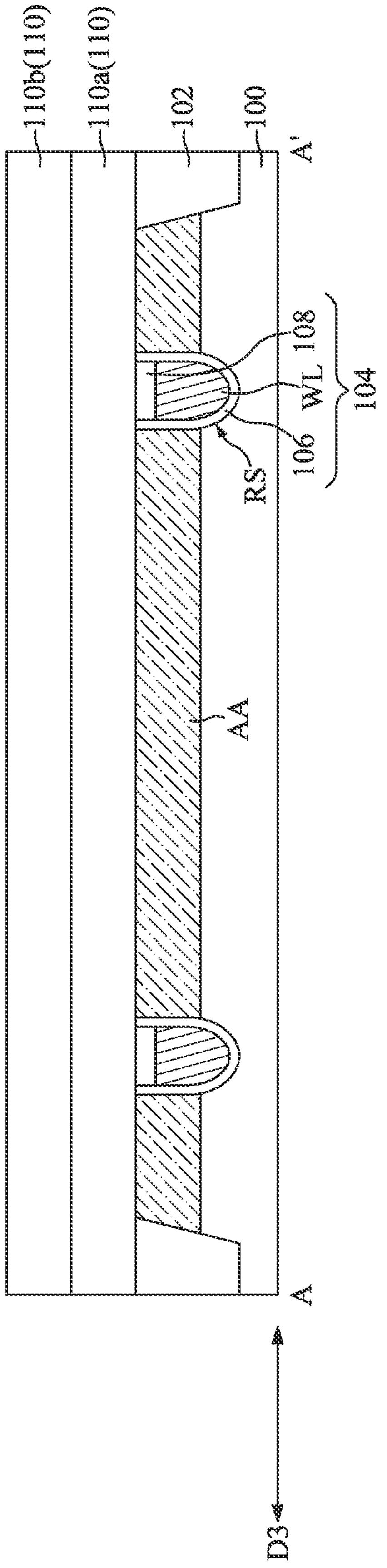

Referring to FIGS. 2 and 3C, step S17 is performed, wherein at least one dielectric layer 110 is formed on the substrate 100. For example, two dielectric layers 110 including a dielectric layer 110*a* and a dielectric layer 110*b* are formed on the substrate 100. In some embodiments, a method for forming the dielectric layers 110*a* and 110*b* includes a deposition process (e.g., a CVD process).

Figure 3D:
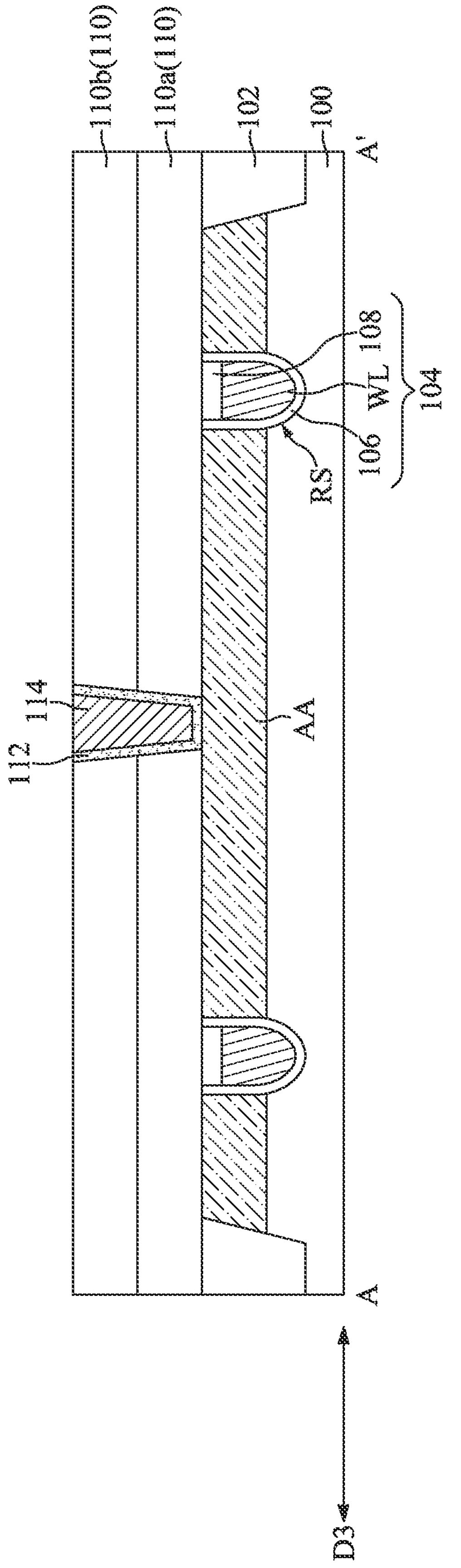

Referring to FIGS. 2 and 3D, step S19 is performed, wherein the bit line contacts BC are formed in the previously-formed dielectric layer(s) 110 (e.g., the dielectric layers 110*a* and 110*b*). In some embodiments, the bit line contacts BC may respectively include the conductive column 114 and the barrier layer 112. In such embodiments, a method for forming the bit line contacts BC may include forming via holes in the dielectric layer(s) 110 (e.g., the dielectric layers 110*a* and 110*b*) by a lithography process and an etching process (e.g., an anisotropic etching process). Subsequently, the barrier layers 112 are conformally formed in the via holes by a deposition process (e.g., a CVD process), and the conductive columns 114 are further deposited in the via holes by another deposition process (e.g., a CVD process) or a plating process. For example, the plating process described in the present disclosure may include an electroplating process or an electro-less plating process. In addition, a planarization process may be performed to remove materials of the conductive columns 114 and the barrier layers 112 outside the via holes.

Figure 3E:
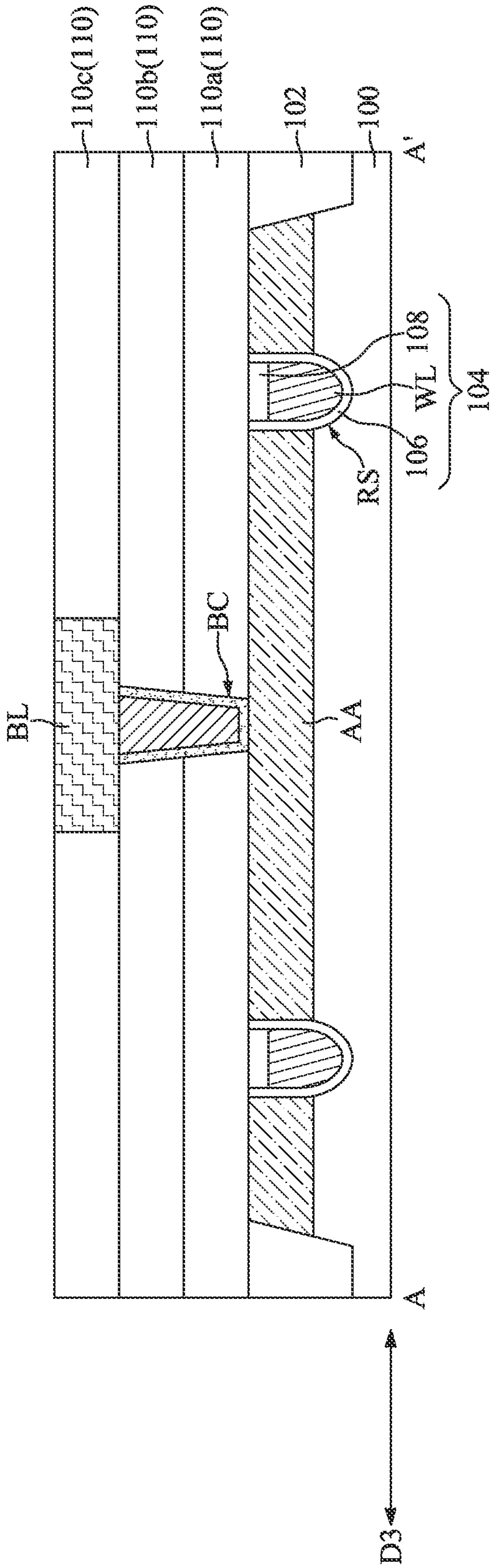

Referring to FIGS. 2 and 3E, step S21 is performed, wherein the bit lines BL and an additional dielectric layer 110 (e.g., a dielectric layer 110*c*) are formed on the current structure. In some embodiments, a method for forming the bit lines BL may include forming trenches in the dielectric layer 110*c*, and depositing a conductive material into the trenches by a deposition process (e.g., a PVD process), a plating process, or a combination thereof. In addition, a planarization process may be performed to remove portions of the conductive material above the dielectric layer 110*c*, and remaining portions of the conductive material form the bit lines BL.

Figure 3F:
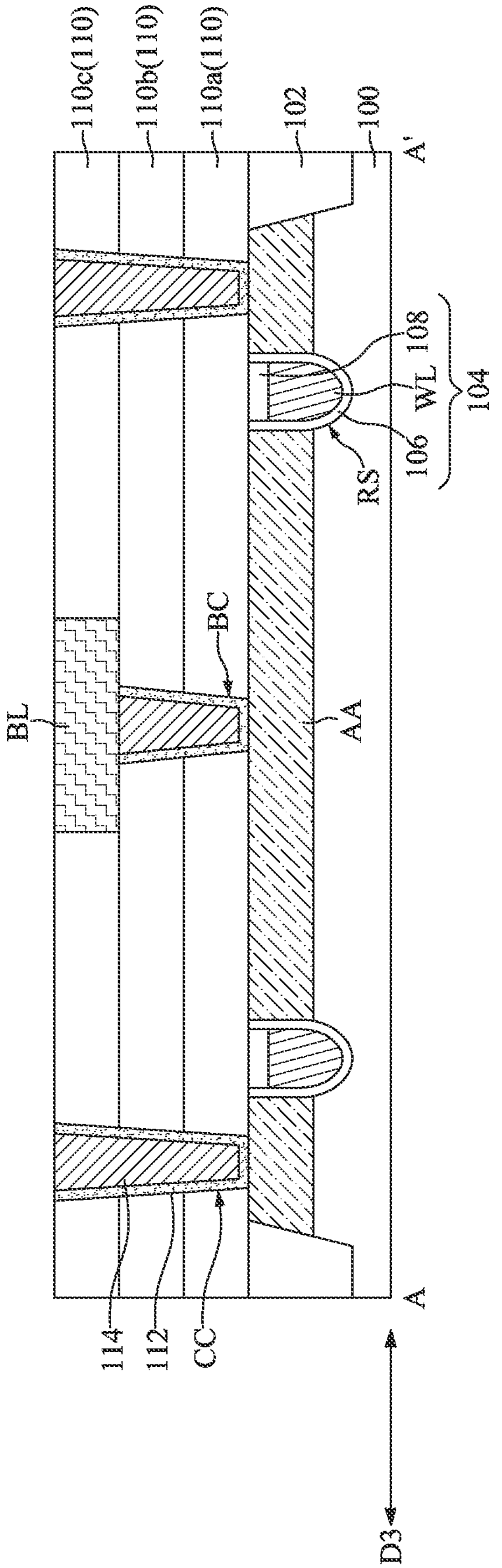

Referring to FIGS. 2 and 3F, step S23 is performed, wherein the capacitor contacts CC are formed in the dielectric layers 110 (e.g., the dielectric layers 110*a* to 110*c*). In some embodiments, a method for forming the capacitor contacts CC is similar to the method for forming the bit line contacts BC, except that deeper via holes are formed for accommodating the capacitor contacts CC.

Figure 3G:
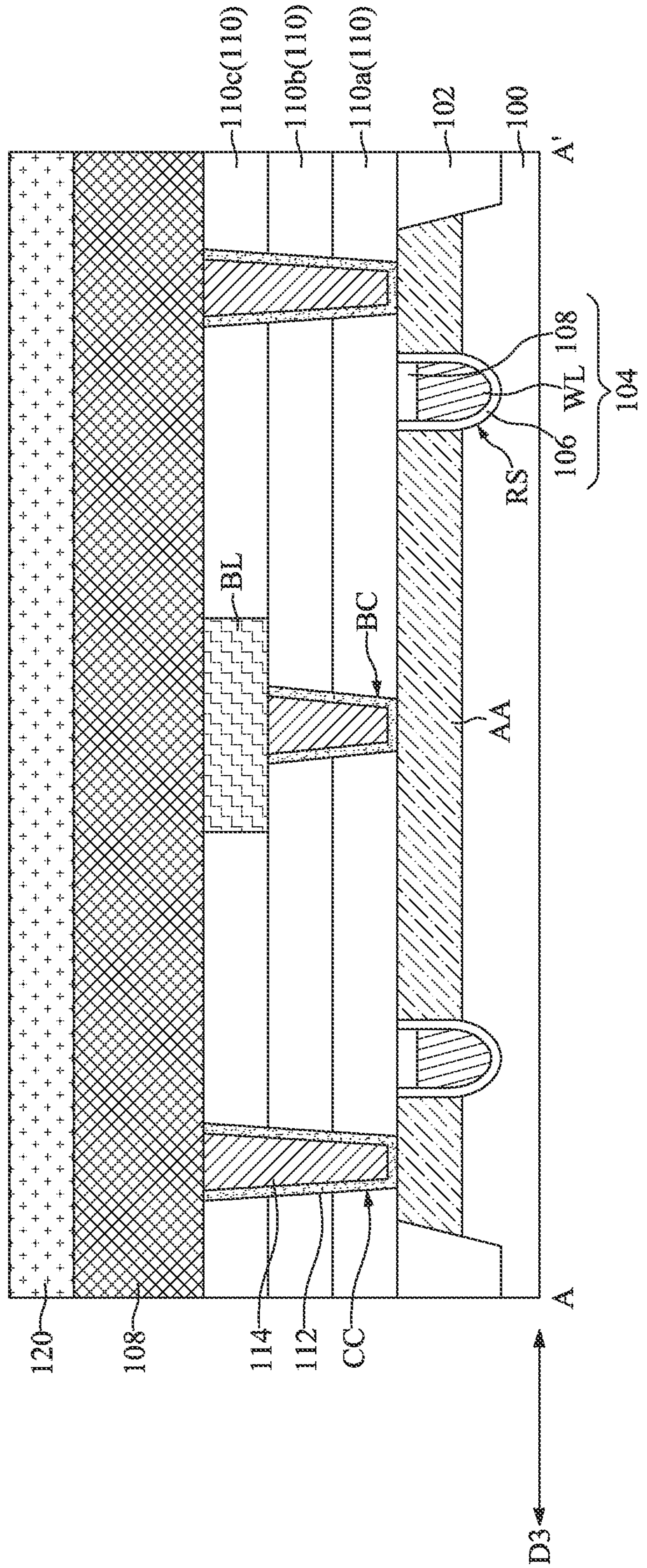

Referring to FIGS. 2 and 3G, step S25 is performed, wherein the first and second conductive layers 108 and 120 are globally formed on the current structure. In other words, the capacitor contacts CC, the bit lines BL and the current topmost dielectric layer 110 (e.g., the dielectric layer 110*c*) may be covered by the first and second conductive layers 118 and 120. The second conductive layer 120 is stacked on the first conductive layer 118. The conductive pillars 116 and the landing pads CP will be formed by patterning the first and second conductive layers 118 and 120 in subsequent steps. In some embodiments, the first conductive layer 118 has a thickness greater than a thickness of the second conductive layer 120. In addition, in some embodiments, a conductive material for forming the second conductive layer 120 has a resistivity lower than a resistivity of the conductive material for forming the first conductive layer 118, and the conductive material for forming the first conductive layer 118 has a sufficient etching selectivity with respect to the conductive material for forming the second conductive layer 120. A method for forming each of the first and second conductive layers 118 and 120 may include a deposition process (e.g., a PVD process), a plating process or a combination thereof.

Figure 3H:
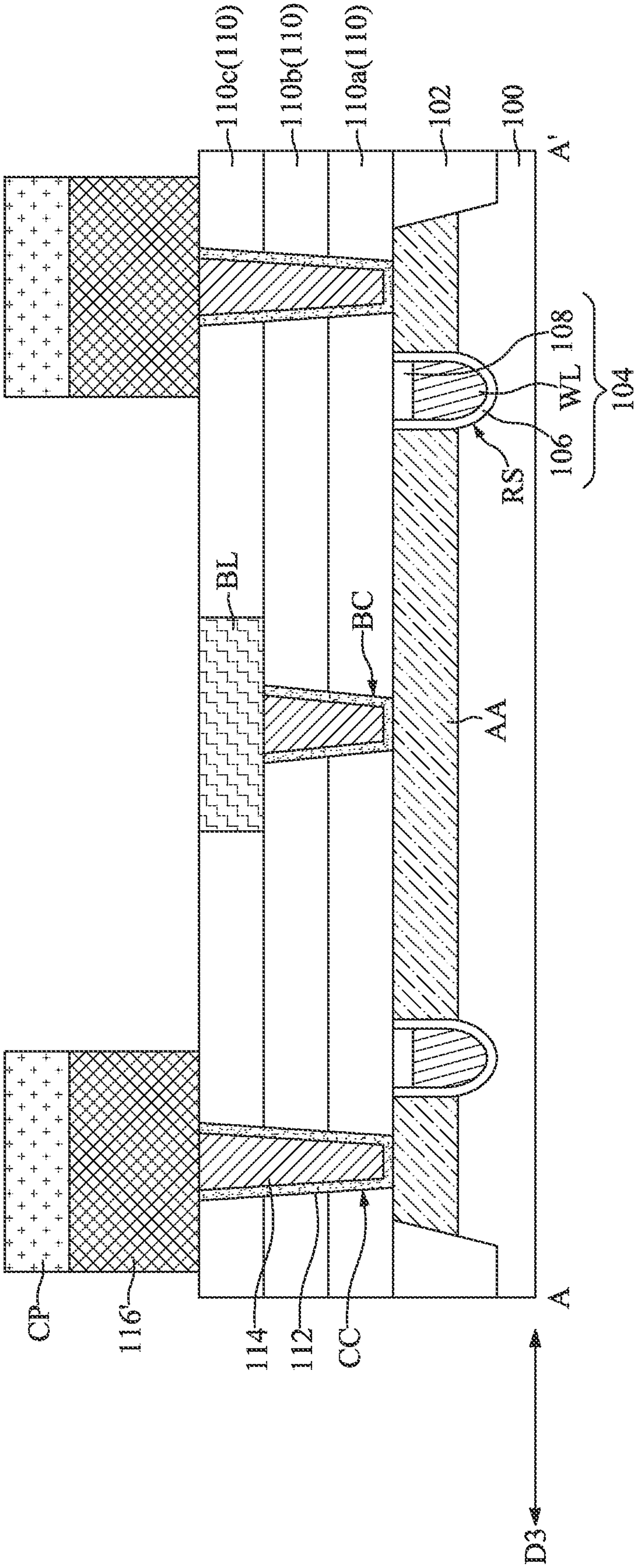

Referring to FIGS. 2 and 3H, step S27 is performed, wherein the first and second conductive layers 118 and 120 are patterned to form initial conductive pillars 116' and the landing pads CP. During such patterning, portions of the first and second conductive layers 118 and 120 are removed, and the bit lines BL as well as portions of the current topmost dielectric layer 110*c* may be exposed. Sidewalls of the formed initial conductive pillars 116' may be substantially coplanar with sidewalls of the formed landing pads CP. In other words, a footprint area of each initial conductive pillar 116' may be substantially identical to a footprint area of the overlying landing pad CP. The conductive pillars 116 will be formed by laterally recessing the initial conductive pillars 116' in the subsequent step. In some embodiments, a method for forming the initial conductive pillars 116' and the landing pads CP may include a lithography process and a first etching process, wherein the first etching process may be a single etching process (e.g., a single anisotropic etching process) or may include two etching processes (e.g., two anisotropic etching processes). When the first etching process is a single etching process, the first and second conductive layers 118 and 120 are partially removed in the same etching process.

Figure 3I:
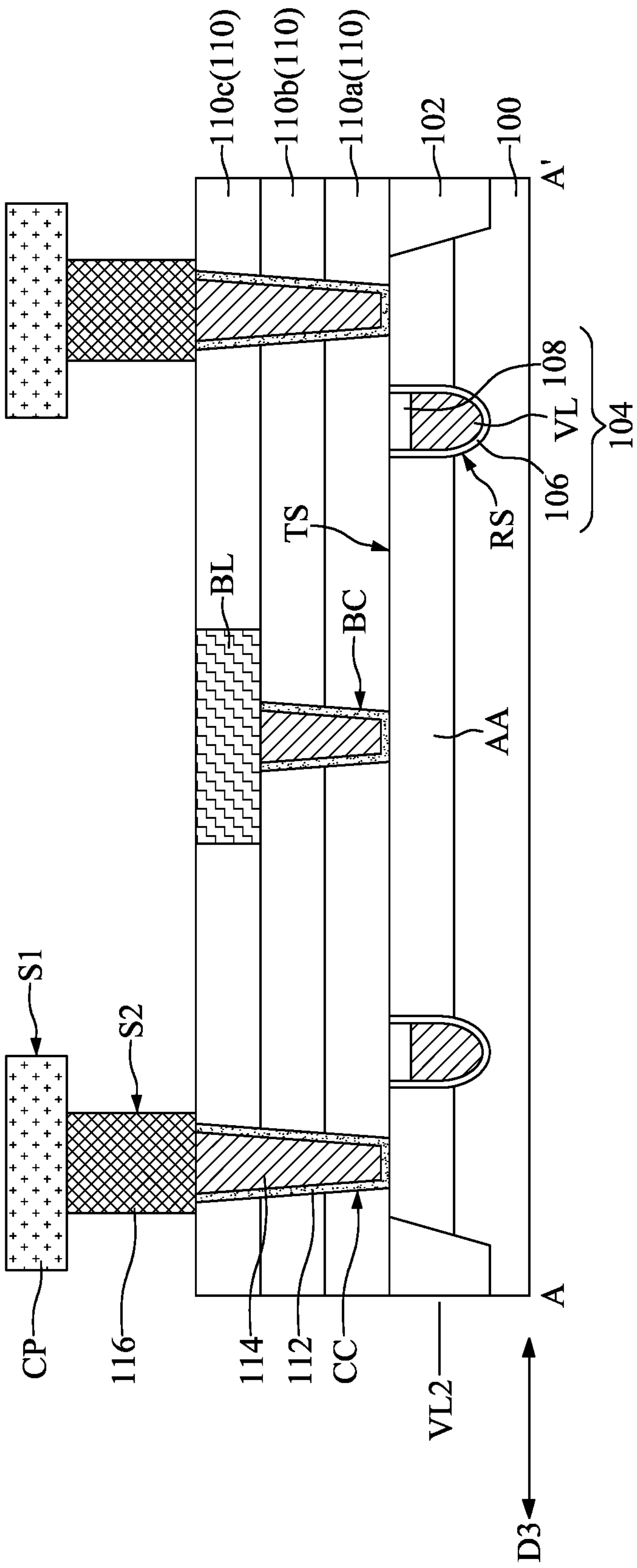

Referring to FIGS. 2 and 3I, step S29 is performed, wherein the initial conductive pillars 116' are laterally recessed, so as to form the conductive pillars 116. In some embodiments, a method for laterally recessing the initial conductive pillars 116' includes a second etching process, such as an isotropic etching process (e.g., a wet etching process). In the embodiments where the conductive material for forming the landing pads CP has a sufficient etching selectivity with respect to the conductive material for forming the initial conductive pillars 116', damage to the landing pads CP may be avoided (or the landing pads CP may be only slightly consumed) during such isotropic etching process. As a consequence, the formed conductive pillars 116 can be laterally recessed with respect to the landing pads CP. In addition, in some embodiments, the conductive material for forming the bit lines BL also has an etching selectivity with respect to the conductive material for forming the initial conductive pillars 116', and the bit lines BL may be undamaged (or only slightly consumed) during the isotropic etching process.

Figure 3J:
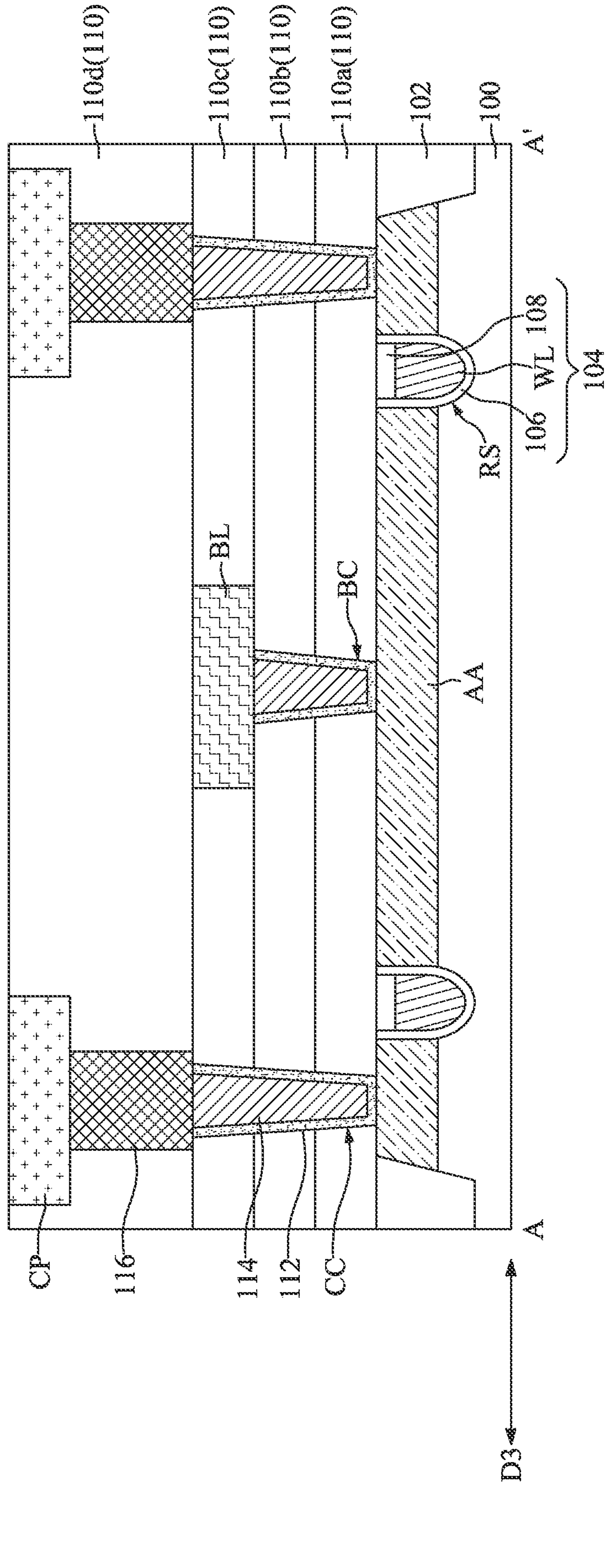
Figure 3K:
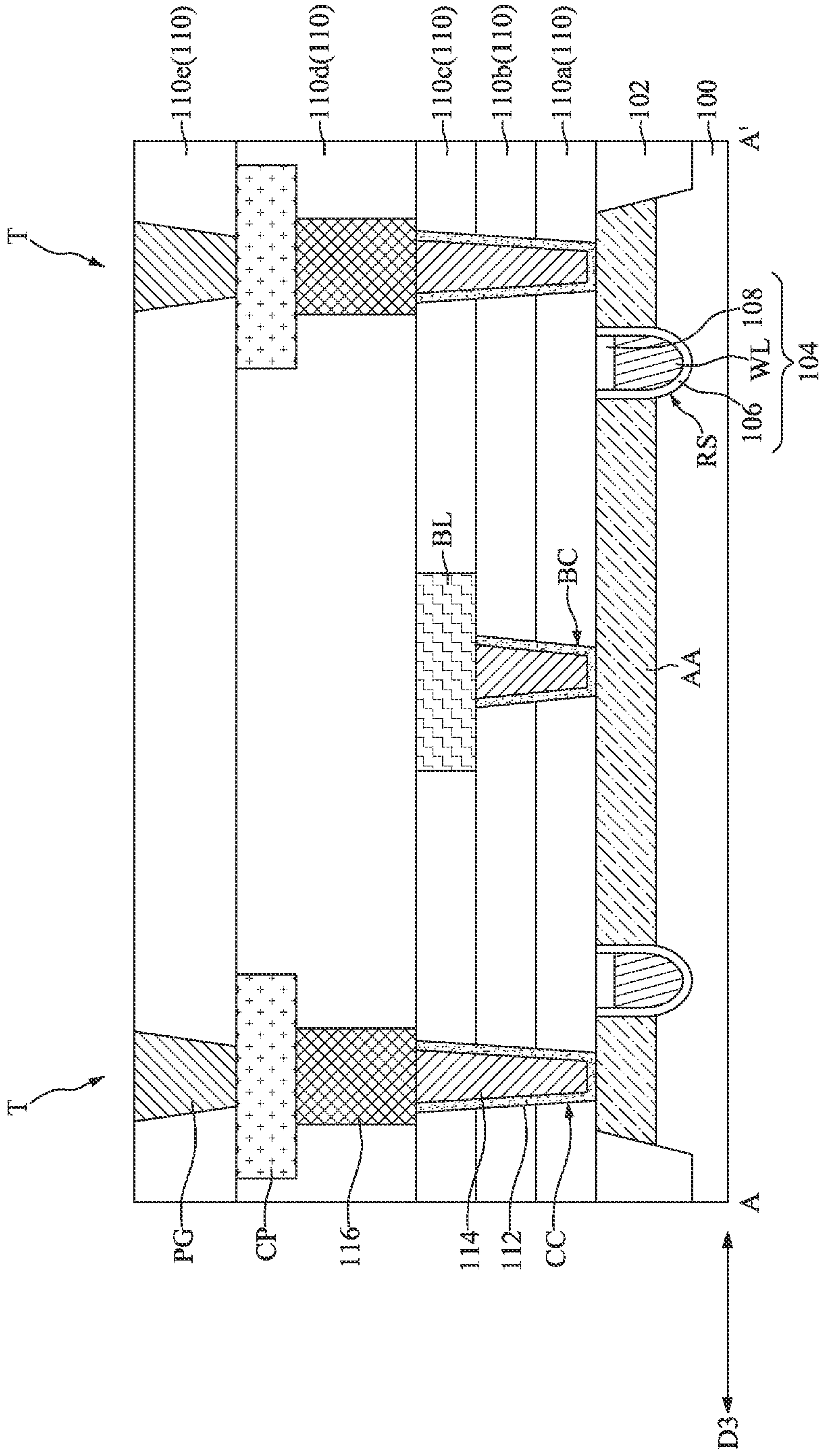
Figure 3L:
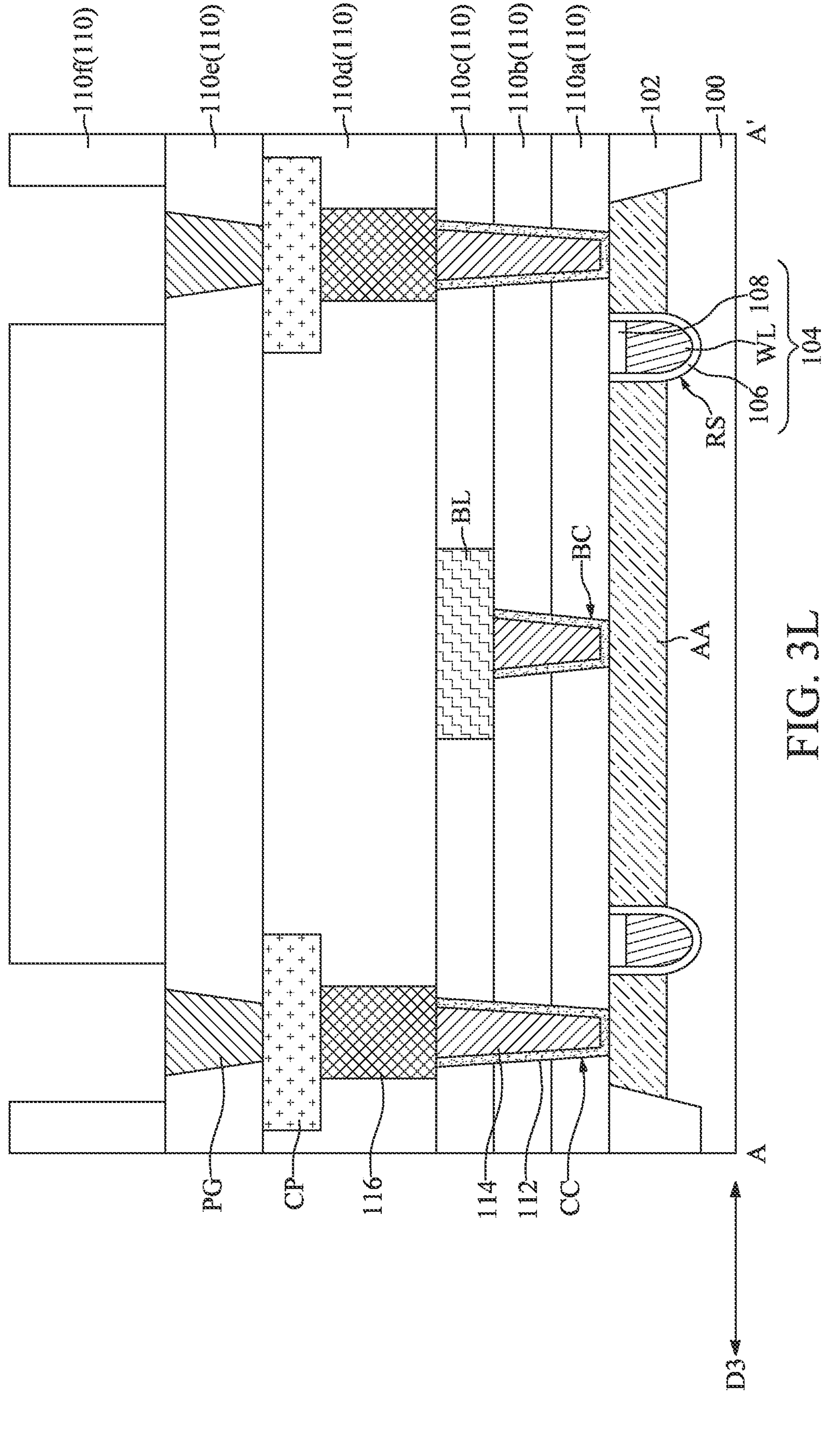
Figure 3M:
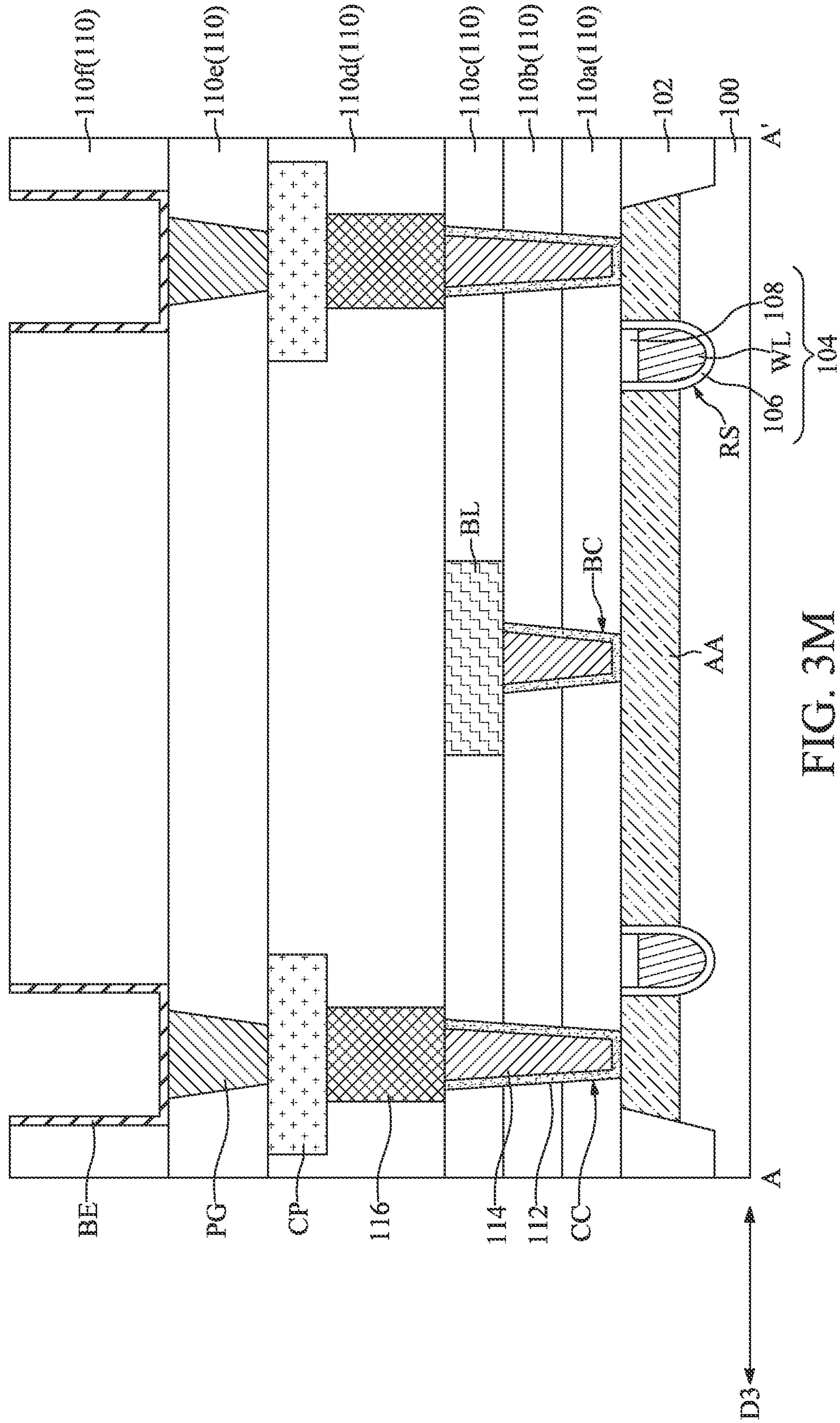
Figure 3N:
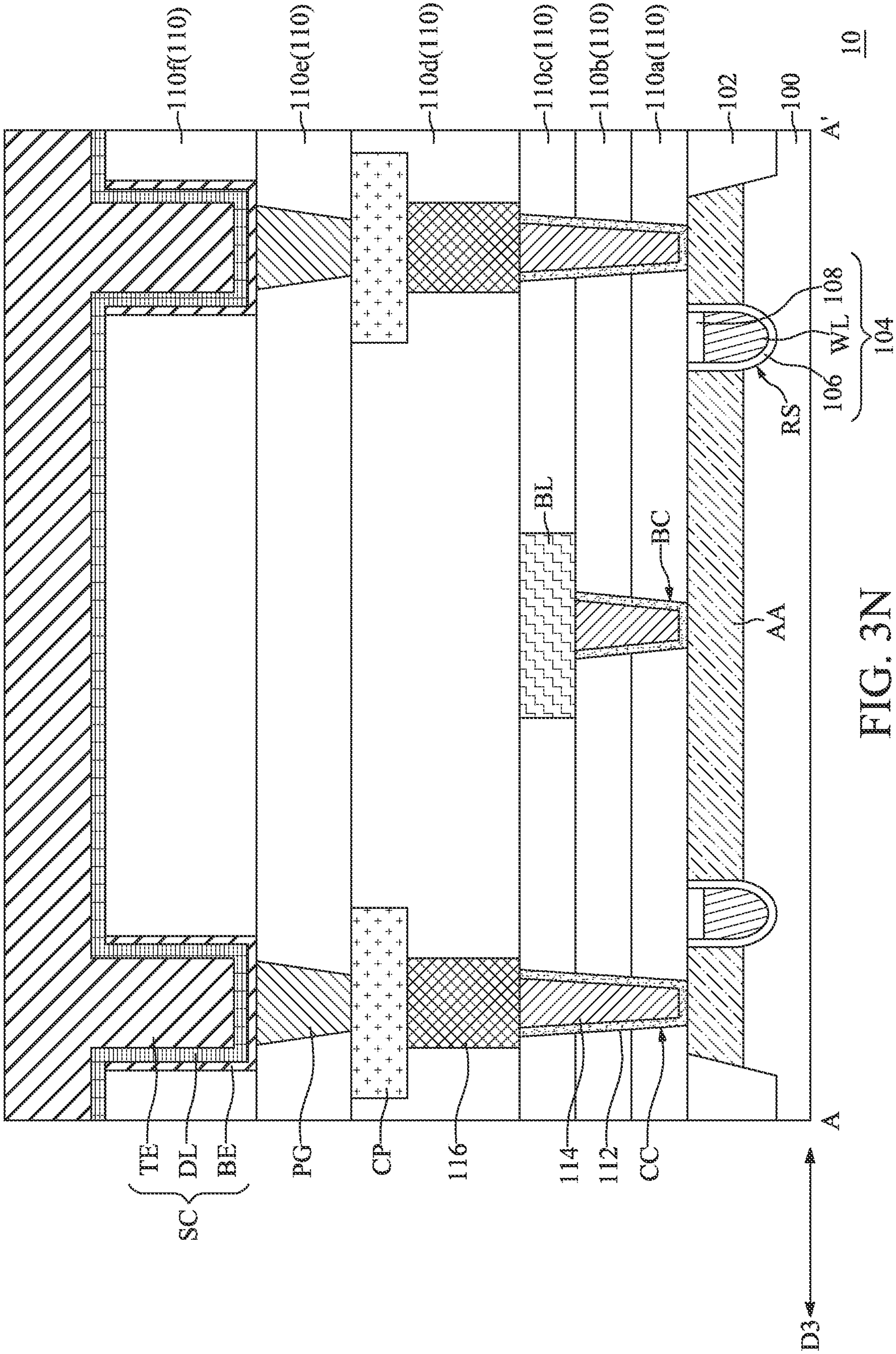
Figure 3O:
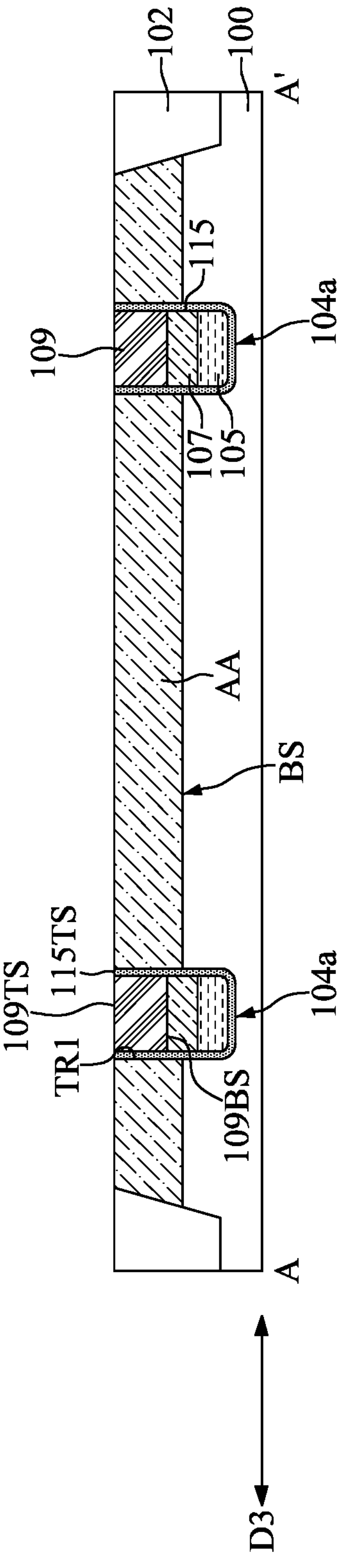
Figure 3P:
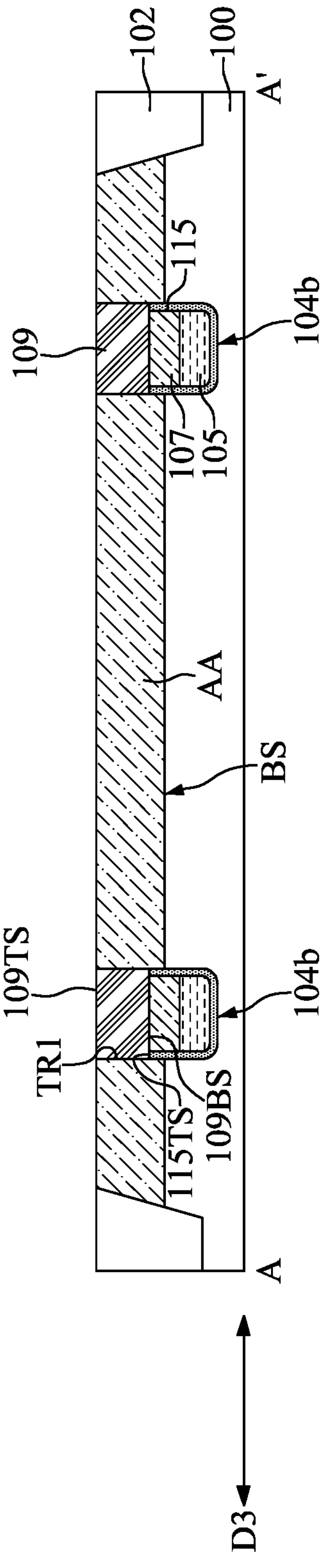
Figure 3Q:
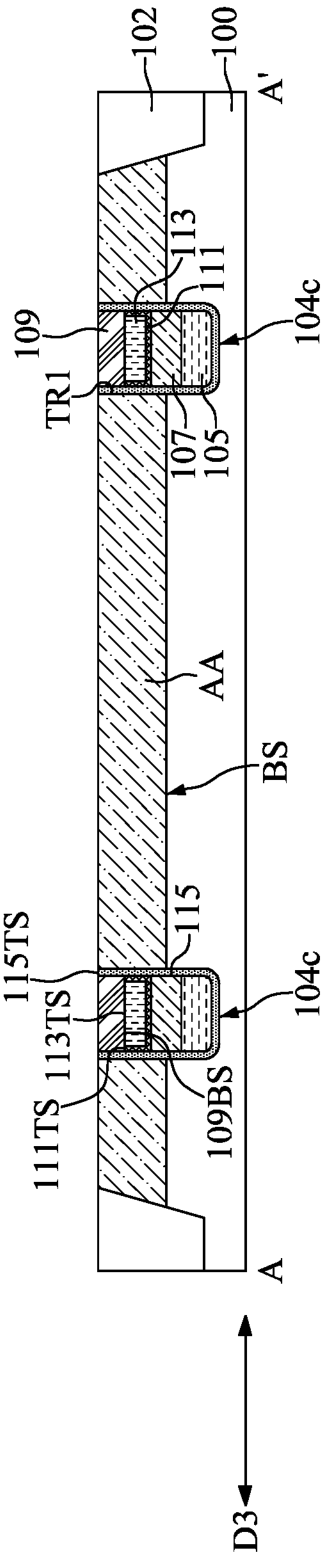
Figure 3R:
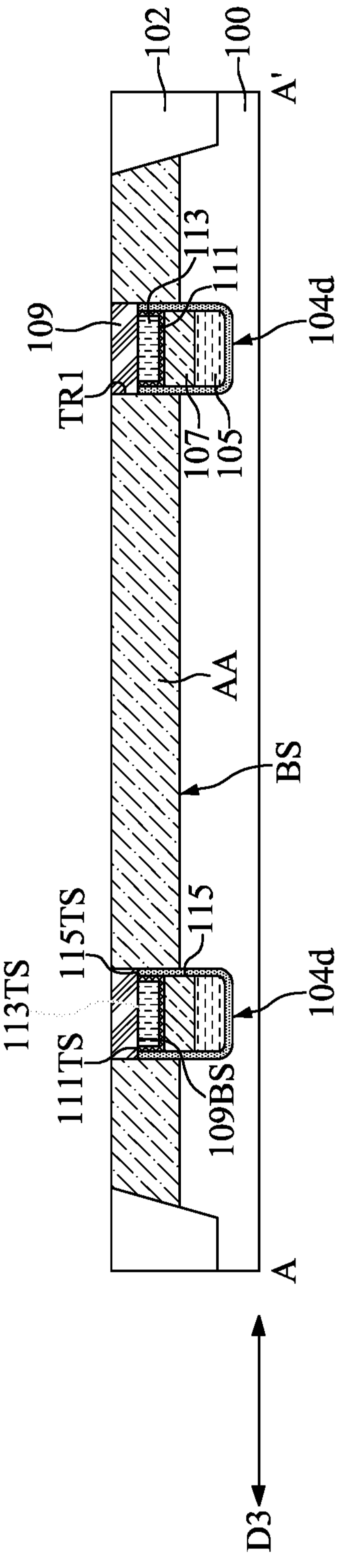
Figure 4:
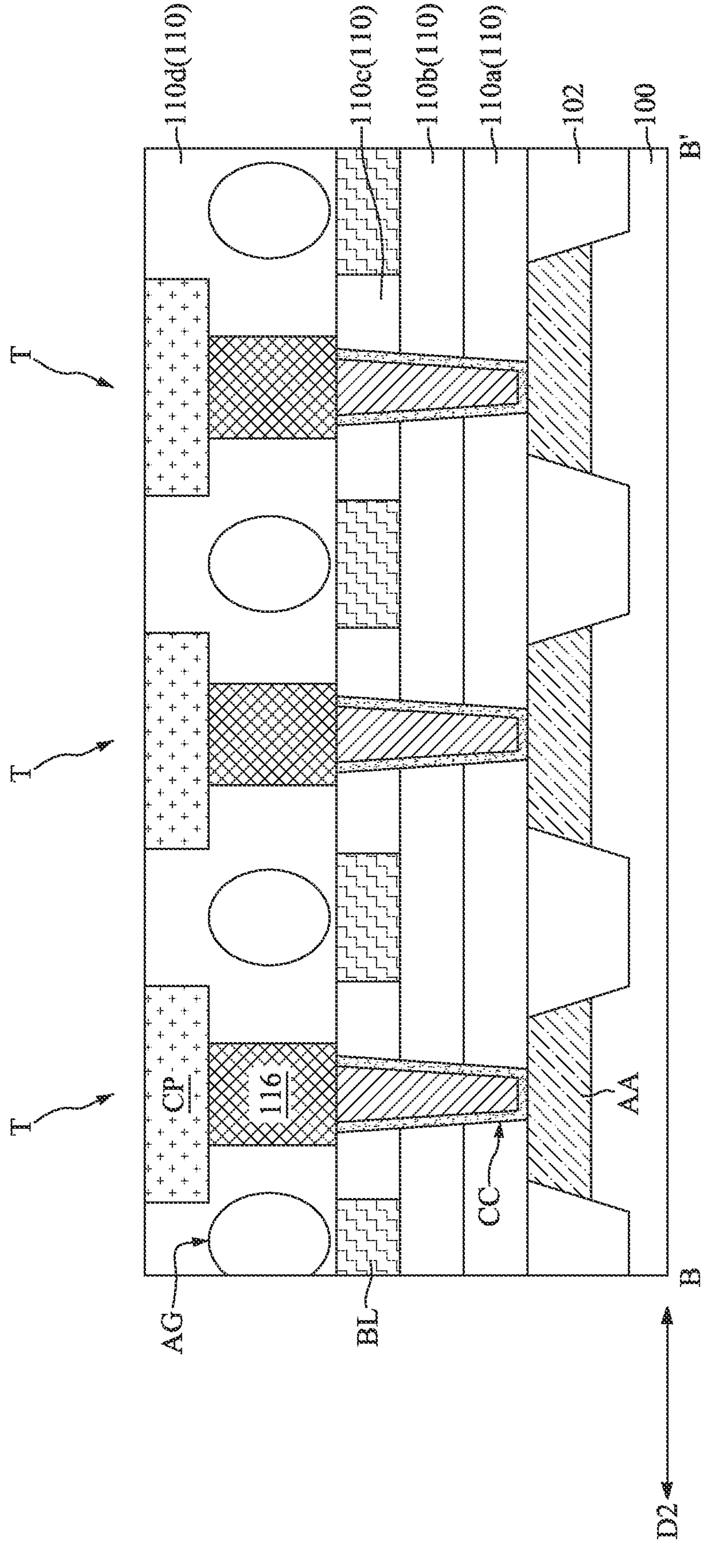
FIG. 4 is another schematic cross-sectional view of the intermediate structure of the semiconductor device at the stage illustrated in FIG. 3J.

Referring to FIGS. 2, 3J and 4, step S31 is performed, wherein another dielectric layer 110 (e.g., the dielectric layer 110*d*) is formed. The conductive pillars 116 and the landing pads CP form stacking structures T on the capacitor contacts CC, and define recesses in between. The dielectric layer 110*d* is deposited in the recesses defined by the stacking structures T. In some embodiments, a method for forming the dielectric layer 110*d* includes a deposition process (e.g., a CVD process), and may further include a planarization process for removing excess material above the landing pads CP. As shown in FIGS. 3 and 4, in some embodiments, a width of the recess between adjacent stacking structures T arranged along a column direction (i.e., the direction D2) is much less than a width of the recess between adjacent stacking structures T arranged along an extending direction of the active regions AA (i.e., the direction D3). As shown in FIG. 4, the dielectric layer 110*d* may not fill the narrow recesses arranged along the column direction (i.e., the direction D2). Since the conductive pillars 116 are laterally recessed from the landing pads CP, a distance between adjacent landing pads CP is less than a distance between adjacent conductive pillars 116. In other words, the recesses defined between the stacking structures T respectively have a relatively narrow top portion and a relatively wide bottom portion. When the dielectric layer 110*d* is deposited in the narrow recesses (i.e., the recesses arranged along the direction D2), the relatively narrow top portions of such recesses may be sealed before the relatively wide bottom portions of the recesses can be filled. As a consequence, the air gaps AG may be formed in the relatively wide bottom portions. In other words, the possibly-formed air gaps AG are located between the conductive pillars 116 arranged along the column direction (i.e., the direction D2). As dimensions of the recesses, deposition conditions, and other parameters vary, the air gaps AG may be formed in different shapes, and top ends of the air gaps AG may or may not extend above top ends of the conductive pillars 116. In some embodiments, the air gaps AG may not expose sidewalls of the conductive pillars 116 or top surfaces of the bit lines BL. In alternative embodiments, some portions of the conductive pillars 116 and/or some portions of the bit lines BL may be exposed by the air gaps AG.

Referring to FIGS. 2 and 3K, step S33 is performed, wherein the capacitor plugs PG and another dielectric layer 110 (e.g., the dielectric layer 110*e*) are formed on the current structure. The dielectric layer 110*e* is located on the dielectric layer 110*d* and the landing pads CP, and the capacitor plugs PG penetrate through the dielectric layer 110*e* to establish an electrical connection with the landing pads CP. In some embodiments, a dielectric material layer may be globally formed on the dielectric layer 110*d* and the landing pads CP by a deposition process (e.g., a CVD process), and through holes are then formed in the dielectric material layer by a lithography process and an etching process (e.g., an anisotropic etching process), to form the dielectric layer 110*e*. Subsequently, a conductive material is deposited in the through holes by a deposition process (e.g., a PVD process), a plating process, or a combination thereof, and a planarization process may be performed to remove portions of the conductive material over the dielectric layer 110*e*. Remaining portions of the conductive material form the capacitor plugs PG.

Referring to FIGS. 2 and 3L, step S35 is performed, wherein one more dielectric layer 110 (e.g., the dielectric layer 110*f*) is formed on the current structure. The dielectric layer 110*f* is located on the dielectric layer 110*e*, and has openings overlapping the capacitor plugs PG. In some embodiments, such openings further overlap portions of the dielectric layer 110*e* surrounding the capacitor plugs PG. In some embodiments, a dielectric material layer may be globally formed on the dielectric layer 110*e* and the capacitor plugs PG by a deposition process (e.g., a CVD process), and openings (as shown in FIG. 3L) are then formed in the dielectric material layer by a lithography process and an etching process (e.g., an anisotropic etching process), to form the dielectric layer 110*f*.

Referring to FIGS. 2 and 3M, step S37 is performed, wherein the bottom electrodes BE are formed on the exposed capacitor plugs PG. The bottom electrodes BE are conformally formed in the openings of the dielectric layer 110*f*, and are separated from one another. Accordingly, the bottom electrodes BE cover the capacitor plugs PG, and establish an electrical connection with the capacitor plugs PG. In embodiments where the openings of the dielectric layer 110*f* further overlap portions of the dielectric layer 110*e* surrounding the capacitor plugs PG, such portions of the dielectric layer 110*e* are covered by the bottom electrodes BE. In some embodiments, a conductive material layer is conformally formed to cover surfaces of the dielectric layer 110*f* as well as exposed surfaces of the capacitor plugs PG and the dielectric layer 110*e*. Next, a planarization process is performed to remove portions of the conductive material layer over the dielectric layer 110*f*. Remaining portions of the conductive material layer form the bottom electrodes BE.

Referring to FIGS. 2 and 3N, step S39 is performed, wherein the dielectric layer DL and the top electrode TE are sequentially formed on the current structure. The dielectric layer DL conformally covers exposed surfaces of the dielectric layer 110*f* and the bottom electrodes BE. The top electrode TE fills the openings of the dielectric layer 110*f*, and covers a top surface of the dielectric layer DL. In some embodiments, the dielectric layer DL and the top electrode TE are globally formed. In such embodiments, the storage capacitors SC share the same dielectric layer DL and the same top electrode TE, but include separate bottom electrodes BE. A method for forming the dielectric layer DL may include a deposition process (e.g., a CVD process), while a method for forming the top electrode TE may include a deposition process (e.g., a PVD process), a plating process or a combination thereof.

In accordance with the descriptions above, the semiconductor device 10 has been formed by a manufacturing method according to some embodiments of the present disclosure. Moreover, the semiconductor device 10 may be subjected to further manufacturing processes and/or testing processes.

Referring to FIG. 2 and FIGS. 3O to 3R, in accordance with alternative embodiments, step S15 is performed, wherein the recess gate structures 104*a*, 104*b*, 104*c* and 104*d* are respectively formed. After the subsequent steps described above (i.e., steps S17 to S39 in FIG. 2) are sequentially performed, the semiconductors 10*a*, 10*b*, 10*c* and 10*c* as shown in FIGS. 1D, 1E, 1F and 1G may be obtained.

As described above, the semiconductor device according to embodiments of the present disclosure includes memory cells arranged as an array. Each memory cell includes a transistor and storage capacitor connected to the transistor. A conductive pillar and a landing pad are disposed between one of the storage capacitors and an active region of the transistor connected to this storage capacitor. The landing pad is disposed on the conductive pillar, and a sidewall of the conductive pillar is recessed from a sidewall of the landing pad. Therefore, a distance between the landing pads of adjacent memory cells is less than a distance between the conductive pillars of adjacent memory cells. As a result, while depositing a dielectric material between stacking structures (each of which includes one of the conductive pillars and the overlying landing pad), the space between adjacent landing pads may be sealed before the space between adjacent conductive pillars is filled. Consequently, air gaps may be formed between the conductive pillars. Due to a low dielectric constant of the air sealed in the air gaps, a parasitic capacitance between the conductive pillars can be reduced by the formation of the air gaps, thus effectively reducing an RC delay of the semiconductor device. As a result, an operation speed of the semiconductor device can be improved. In embodiments where a resistivity of the landing pads is less than a resistivity of the conductive pillars, the parasitic capacitance between the landing pads may be limited, even though the space between the landing pads is narrower than the space between the conductive pillars.

In an aspect of the present disclosure, a semiconductor device is provided. The semiconductor device comprises: a substrate having an active region; a recess gate structure disposed in the substrate and intersecting the active region; a conductive pillar disposed over the substrate and electrically connected to the active region; a landing pad disposed on the conductive pillar and electrically connected to the conductive pillar; and a stack of dielectric layers disposed over the substrate and laterally surrounding the conductive pillar and the landing pad.

In another aspect of the present disclosure, a semiconductor device is provided. The semiconductor device comprises: a substrate; a word line disposed in the substrate; a dielectric liner disposed between the substrate and the word line and surrounding the word line; an insulative plug disposed in the substrate and extending into the word line; and an impurity region disposed in the substrate and on either side of the word line, wherein the impurity region serve as a source/drain region of a recessed access device (RAD) transistor.

In another aspect of the present disclosure, a method for manufacturing a semiconductor device is provided. The method comprises: forming an active region in a substrate; forming a recess gate structure in the substrate, wherein the recess gate structure intersects the active region; forming at least one dielectric layer on the substrate; forming a bit line contact in the at least one dielectric layer; forming a bit line over the bit line contact and in an additional dielectric layer; forming a contact structure on the substrate, wherein the contact structure is located at a side of the recess gate structure, and is electrically connected to the active region; sequentially forming a first conductive layer and a second conductive layer over the substrate, wherein the contact structure is covered by the first and second conductive layers; forming a conductive pillar and a landing pad over the substrate, wherein the conductive pillar overlaps and electrically connects to the contact structure, the landing pad covers and electrically connects to the conductive pillar, and a sidewall of the conductive pillar is laterally recessed from a sidewall of the landing pad; and forming a dielectric layer to laterally surround the conductive pillar and the landing pad.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:

forming an active region in a substrate;

forming a recess gate structure in the substrate, wherein the recess gate structure intersects the active region;

forming at least one dielectric layer on the substrate;

forming a bit line contact in the at least one dielectric layer;

forming a bit line over the bit line contact and in an additional dielectric layer;

forming a contact structure on the substrate, wherein the contact structure is located at a side of the recess gate structure, and is electrically connected to the active region;

sequentially forming a first conductive layer and a second conductive layer over the substrate, wherein the contact structure is covered by the first and second conductive layers;

forming a conductive pillar and a landing pad over the substrate, wherein the conductive pillar overlaps and electrically connects to the contact structure, the landing pad covers and electrically connects to the conductive pillar, and a sidewall of the conductive pillar is laterally recessed from a sidewall of the landing pad; and forming a dielectric layer to laterally surround the conductive pillar and the landing pad;

wherein the recess gate structure is formed by:

conformally forming a gate insulating layer in a trench disposed in the substrate at a position that the gate insulating layer is formed on side surfaces and a bottom surface of the trench;

forming a work function layer on the gate insulating layer and in the trench;

forming a first conductive layer on the work function layer and in the trench; and forming a capping layer on the first conductive layer and in the trench;

wherein the first conductive layer is sandwiched between the word function layer and the capping layer;

wherein the word function layer and the first conductive layer are surrounded by the gate insulating layer;

wherein a width of the first conductive layer is equal to a width of the word function layer;

wherein a top surface of the capping layer and a top surface of the substrate are coplanar with each other.

2. The method of claim 1, wherein the formation of the landing pad is performed by a first etching process.

3. The method of claim 2, wherein the formation of the conductive pillar is performed by the first etching process and sequentially by a second etching process.

4. The method of claim 3, wherein the first etching process is an anisotropic etching process, and the second etching process is an isotropic etching process.

5. The method of claim 1, further comprising: forming a capacitor plug disposed over and electrically connected to the landing pad.

6. The method of claim 5, further comprising: forming a storage capacitor disposed over and electrically connected to the capacitor plug.

7. The method of claim 1, wherein the recess gate structure further comprises:

conformally disposing a liner layer on the first conductive layer and on the gate insulating layer, and disposed between the capping layer and the first conductive layer; and disposing a second conductive layer between the capping layer and the liner layer;

wherein the liner layer is formed in a U-shaped cross-sectional profile for the second conductive layer disposing therein;

wherein a width of the liner layer, the width of the conductive layer and the width of the word function layer are equal.

8. The method of claim 7, wherein a top surface of the liner layer is coplanar with a bottom surface of the capping layer, wherein the liner layer is in contact with the gate insulating layer.

9. The method of claim 8, wherein a top surface of the second conductive layer, the top surface of the liner layer, and the bottom surface of the capping layer are coplanar.

10. The method of claim 7, wherein the liner layer is formed of a material having an etching selectivity to the gate insulating layer.

11. The method of claim 10, wherein the liner layer is formed of a material including $sp^2$ hybridized carbon atoms.

12. The method of claim 7, wherein the second conductive layer is formed of molybdenum.

13. The method of claim 12, wherein the second conductive layer is formed by a chemical vapor deposition process.

14. The method of claim 1, wherein a top surface of the gate insulating layer is positioned below the top surface of the substrate.

15. The method of claim 14, wherein the top surface of the gate insulating layer is in contact with a bottom surface of the capping layer.

16. The method of claim 14, wherein a width of the conductive layer is less than a width of the capping layer.

* * * * *